(12) United States Patent
Kato et al.

(10) Patent No.: US 8,946,882 B2
(45) Date of Patent: Feb. 3, 2015

(54) SEMICONDUCTOR MODULE AND SEMICONDUCTOR DEVICE

(71) Applicant: Denso Corporation, Kariya, Aichi-pref. (JP)

(72) Inventors: Chikage Kato, Aichi-ken (JP); Yoshiyuki Yamauchi, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/799,787

(22) Filed: Mar. 13, 2013

(65) Prior Publication Data

US 2013/0241043 A1 Sep. 19, 2013

(30) Foreign Application Priority Data

Mar. 15, 2012 (JP) ................... 2012-058219

(51) Int. Cl.
| | | |
|---|---|---|
| *H01L 23/34* | (2006.01) | |
| *H01L 23/373* | (2006.01) | |
| H01L 23/427 | (2006.01) | |
| *H01L 23/433* | (2006.01) | |
| *H01L 25/07* | (2006.01) | |
| H01L 23/051 | (2006.01) | |
| H01L 23/498 | (2006.01) | |

(52) U.S. Cl.
CPC ............. *H01L 23/34* (2013.01); *H01L 23/373* (2013.01); *H01L 23/427* (2013.01); *H01L 23/4334* (2013.01); *H01L 25/072* (2013.01);
(Continued)

(58) Field of Classification Search
CPC ............. H01L 23/492; H01L 23/4922; H01L 23/4924; H01L 23/32; H01L 23/367; H01L 23/373; H01L 23/4012; H01L 23/4334; H01L 23/3157; H01L 24/34; H01L 23/434; H01L 23/36; H01L 23/28; H01L 23/48; H01L 23/50; H01L 23/3107
USPC .................. 257/686, 690, 712, 713, 715, 723
See application file for complete search history.

(56) References Cited

U.S. PATENT DOCUMENTS 7,271,477 B2 * 9/2007 Saito et al. ..................... 257/686
7,547,966 B2 * 6/2009 Funakoshi et al. ............ 257/707
(Continued)

FOREIGN PATENT DOCUMENTS

| JP | 2005-116621 | 4/2005 |
|---|---|---|
| JP | 2005-191082 | 7/2005 |

(Continued)

OTHER PUBLICATIONS

Office Action (2 pages) mailed Mar. 11, 2014, issued in corresponding Japanese Application No. 2012-058219 and English translation (1 page).
(Continued)

*Primary Examiner* — Peniel M Gumedzoe
(74) *Attorney, Agent, or Firm* — Nixon & Vanderhye PC

(57) ABSTRACT

A semiconductor module includes at least one intermediate plate which has heat conductivity, power semiconductor elements which are provided for respective main surfaces of the intermediate plate, heat sinks which are arranged so that the power semiconductor elements are held between the heat sinks and the intermediate plate, and a mold part which seals the intermediate plate, the power semiconductor elements, and the heat sinks with mold resin. Surfaces of the heat sinks opposite to the side of the power semiconductor elements are exposed from the mold part. The intermediate plate has an intermediate radiator which projects in the direction parallel to the main surface from the mold part.

11 Claims, 20 Drawing Sheets

(52) U.S. Cl.
CPC ............ *H01L25/074* (2013.01); *H01L 23/051* (2013.01); *H01L 2224/48091* (2013.01); *H01L 2224/48247* (2013.01); *H01L 23/4985* (2013.01)
USPC ........... 257/690; 257/686; 257/712; 257/713; 257/715; 257/723

(56) References Cited

U.S. PATENT DOCUMENTS

| | | |
|---|---|---|
| 2007/0044952 A1 | 3/2007 | Kuno et al. |
| 2007/0075419 A1 | 4/2007 | Fukuda et al. |
| 2009/0160265 A1 | 6/2009 | Takenaka et al. |
| 2009/0302444 A1* | 12/2009 | Ueda et al. .................... 257/675 |
| 2011/0316143 A1* | 12/2011 | Noritake et al. .............. 257/713 |

FOREIGN PATENT DOCUMENTS

| | | |
|---|---|---|
| JP | 2007-073674 | 3/2007 |
| JP | 2009-153342 | 7/2009 |

OTHER PUBLICATIONS

Office Action (1 pg.) dated Aug. 26, 2014 issue in corresponding Japanese Application No. 2012-058219 with an at least partial English-language translation thereof (2 pgs.)

* cited by examiner

SEMICONDUCTOR MODULE AND SEMICONDUCTOR DEVICE

CROSS-REFERENCE TO RELATED APPLICATION

This application is based on and claims the benefit of priority from earlier Japanese Patent Application No. 2012-58219 filed Mar. 15, 2012, the description of which is incorporated herein by reference.

BACKGROUND 1. (Technical Field)

The present invention relates to a semiconductor module including power semiconductors, and a semiconductor device configured to cool the semiconductor module by using an evaporative cooler.

2. (Related Art)

A power converter installed in a hybrid car, an electric car or the like uses a semiconductor module including power semiconductor devices. To make a motor and the like driven by high-powered power converters, it is required that larger current flows through the semiconductor module, which raises a problem of an increase occurring of the amount of heat generation.

To solve the above problem, JP-A-2005-191082 discloses a semiconductor module, which is an example of a semiconductor module having high heat removal. In this semiconductor module, power semiconductor devices are arranged between a pair of heat sinks. The heat generated from the power semiconductor devices is removed from both surfaces thereof, thereby improving heat removal.

However, when using the above semiconductor module for the power converter, it is difficult to miniaturize the power converter. That is, when configuring a power converter circuit such as an inverter circuit with the above semiconductor module, more than one semiconductor module is required, which increases the number of components of the power converter circuit.

Meanwhile, it can be considered that a unified semiconductor module is configured by arranging a plurality of power semiconductor elements inside the semiconductor module. If a plurality of power semiconductor elements are arranged in the direction parallel to the main surface of a heat sink, the area of the heat sink increases. Hence, the semiconductor module cannot be prevented from increasing in size.

To solve the above problem, it can be considered that a plurality of power semiconductor elements are arranged in the direction perpendicular to the main surface of the heat sink. However, in this case, the area in which the heat sink contacts the power semiconductor element decrease, which increases heat resistance between the heat sink and the power semiconductor element. Hence, heat removal of the semiconductor module can degrade.

SUMMARY

An embodiment provides a semiconductor module which is small in size and has excellent heat removal.

As an aspect of the embodiment, a semiconductor module includes: at least one intermediate plate which has heat conductivity; power semiconductor elements which are provided for respective main surfaces of the intermediate plate; heat sinks which are arranged so that the power semiconductor elements are held between the heat sinks and the intermediate plate; and a mold part which seals the intermediate plate, the power semiconductor elements, and the heat sinks with mold resin. Surfaces of the heat sinks opposite to the side of the power semiconductor elements are exposed from the mold part. The intermediate plate has an intermediate radiator which projects in the direction parallel to the main surface from the mold part.

DETAILED DESCRIPTION OF THE PREFERRED EMBODIMENTS

Figure 1:
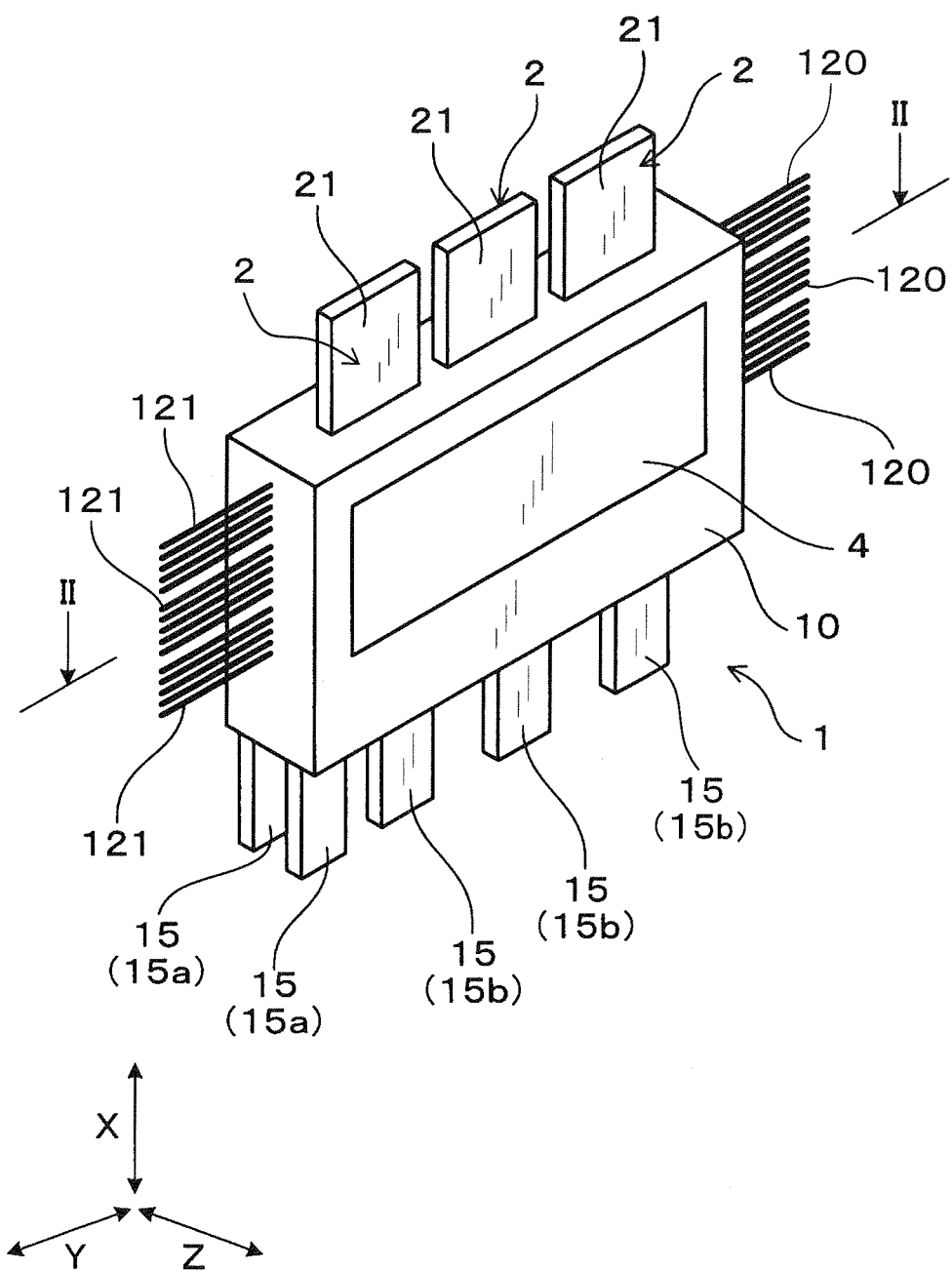
FIG. 1 is a perspective view of a semiconductor module according to a first embodiment.

With reference to the accompanying drawings, hereinafter are described embodiments of the present invention.

(First Embodiment)

An embodiment of a semiconductor module will be described with reference to FIGS. 1 to 7. As shown in FIG. 2, a semiconductor module 1 includes intermediate plates 2 having heat conductivity, and an RC-IGBT (Reverse Conducting-Insulated Gate Bipolar Transistor) elements 3 (3a, 3b) serving as power semiconductor elements. Each of the intermediate plates 2 has a pair of main surfaces. The RC-IGBT elements 3 are arranged close to (provided for) the respective main surfaces of the intermediate plates 2. The semiconductor module 1 further includes a pair of heat sinks 4 and a mold part 10. The RC-IGBT elements 3 are held between the heat sinks 4 and the intermediate plates 2. The mold part 10 seals the intermediate plates 2, the RC-IGBT elements 3, and the heat sinks 4 with mold resin. As shown in FIG. 2, surfaces of the heat sinks 4 opposite to the side of the RC-IGBT elements 3 are exposed from the mold part 10. Each of the intermediate plates 2 has an intermediate radiator 21 shown in FIG. 1 which projects in the direction parallel to a pair of main surfaces 20 (20a, 20b) from the mold part 10.

Figure 2:
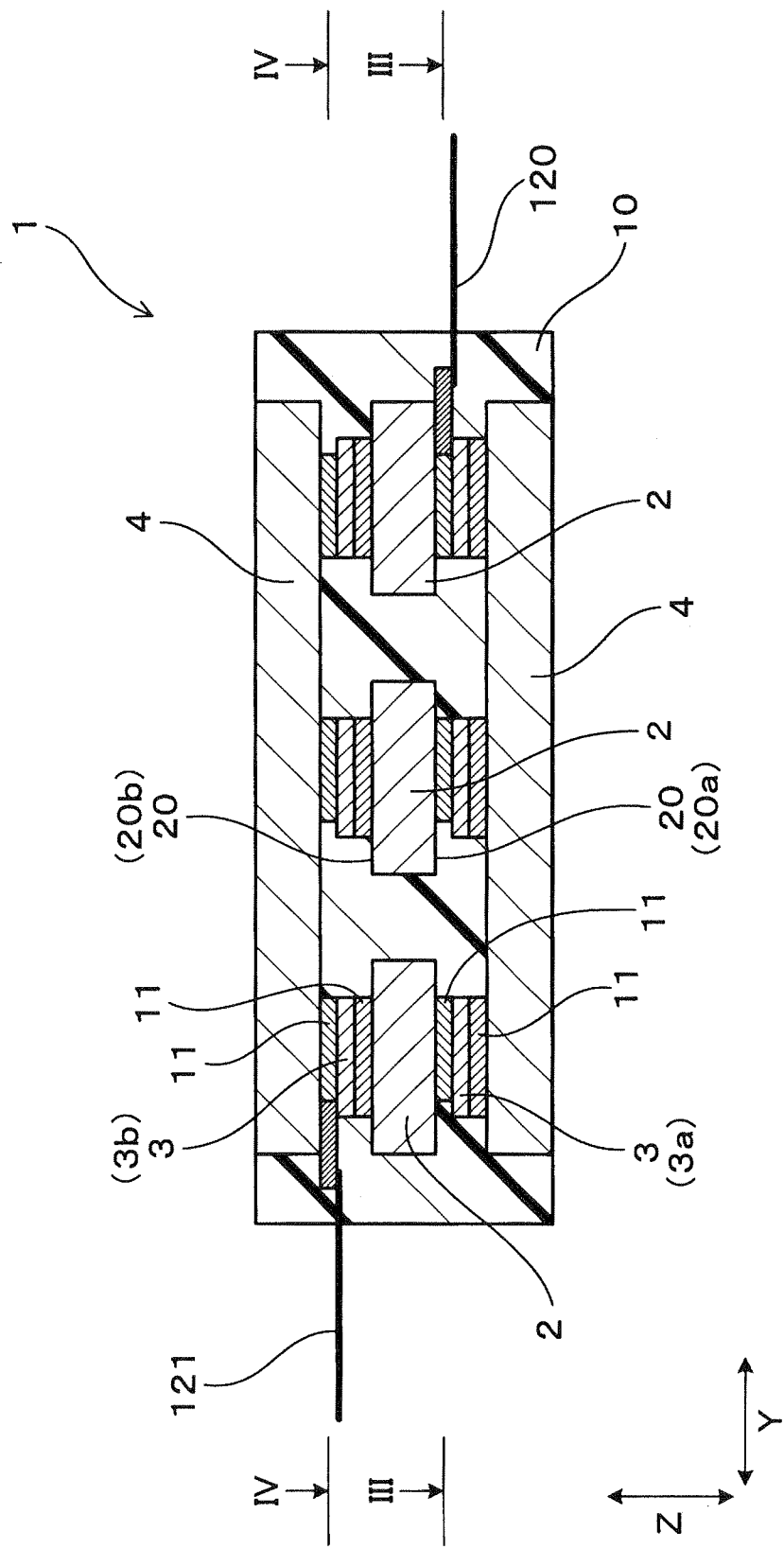
FIG. 2 is a sectional view taken in the direction of arrows II of FIG. 1.

As shown in FIG. 1, the semiconductor module 1 has a substantial rectangular parallelepiped shape. Intermediate radiators 21 project from a surface of the semiconductor module 1. (Hereinafter, the direction in which the intermediate radiators 21 project is referred to as "projection direction X"). A plurality of power terminals 15 (15a, 15b), which provide electric power to the semiconductor module 1 and receive electric power from the semiconductor module 1, are arranged on a surface opposite to the surface from which the intermediate radiators 21 project. In addition, as shown in FIG. 2, parts of the heat sinks 4 are exposed from the mold part 10 at a pair of surfaces in the thickness direction of the intermediate plates 2 (hereinafter, referred to as "thickness direction Z") which is orthogonal to the projection direction X. In addition, as shown in FIGS. 1 and 2, first control terminals 120 and second control terminals 121 project from a pair of surfaces in the direction orthogonal to both the projection direction X and the thickness direction Z (hereinafter, referred to as "width direction Y"). The first control terminals 120 and the second control terminals 121, which transmit control signals to the RC-IGBT elements 3 and receive control signals from the RC-IGBT elements 3, are arranged so as to extend in the directions parallel to the pair of main surfaces 20 (width direction Y) of the intermediate plates 2, the directions they extend in being opposite to each other.

Figure 6:
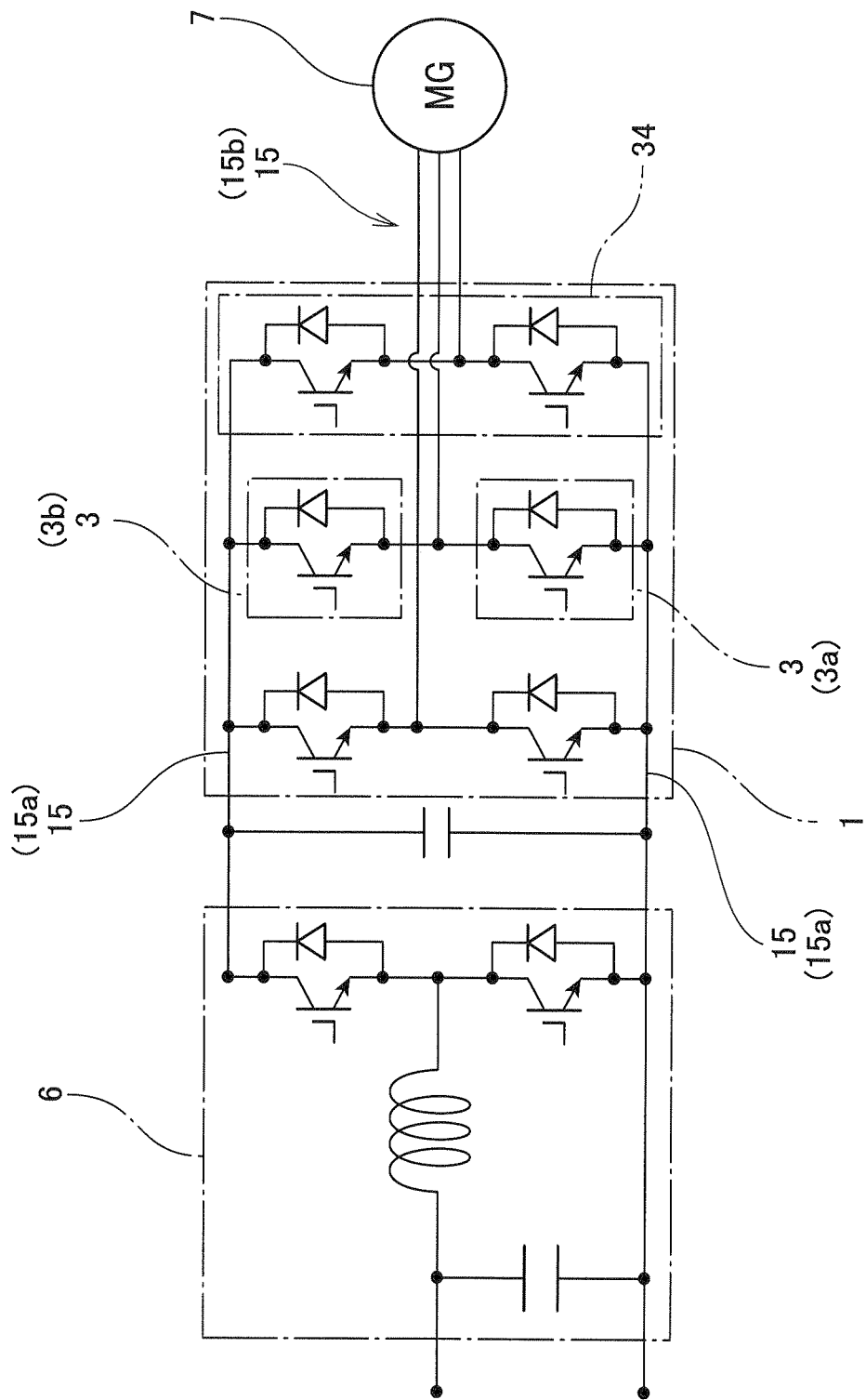
FIG. 6 is a diagram for explaining a power converter circuit using the semiconductor module according to the first embodiment.

As shown in FIG. 2, the semiconductor module 1 includes six RC-IGBT elements 3. The RC-IGBT elements 3 are electrically connected to each other, thereby forming an inverter circuit shown in FIG. 6. That is, in the semiconductor module 1, three series connections 34 are formed, in each of which the RC-IGBT elements 3a and 3b are connected in series, so as to be in parallel to each other. Note that, in the present embodiment, as shown in FIG. 6, a boost converter 6 is connected to the power terminal 15a. An electric rotating machine 7 is connected to the power terminal 15b.

Figure 4:
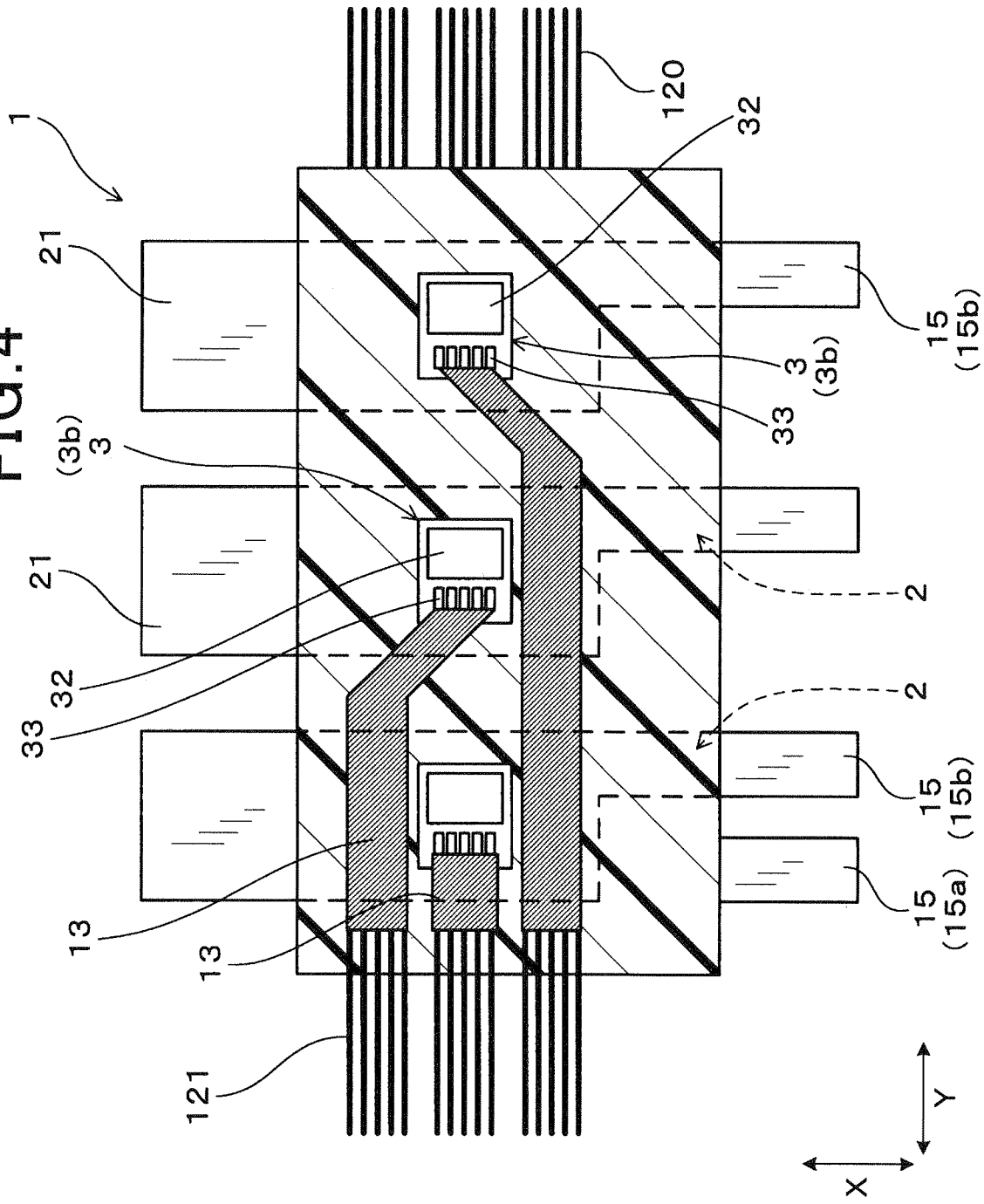
FIG. 4 is a sectional view taken in the direction of arrows IV of FIG. 2.

As shown in FIG. 4, in the semiconductor module 1, three intermediate plates 2 are arranged in the width direction. Each of the intermediate plates 2 is a copper plate having a substantial rectangular shape, and is previously applied with nickel plating at the same area when viewed in the thickness direction Z. In the area where the nickel plating is applied, as shown in FIG. 2, a pair of RC-IGBT elements 3a and 3b is joined with solder 11. Hence, the pair of RC-IGBT elements 3a and 3b is arranged at the same position when viewed in the thickness direction of the intermediate plate 2. The RC-IGBT elements 3a and 3b are connected in series, thereby forming the series connection 34 shown in FIG. 6.

As shown in FIG. 4, one end in the projection direction X of the intermediate plate 2 projects from the mold part 10, thereby configuring the intermediate radiator 21. The other end of the intermediate plate 2 in the projection direction X extends to the side opposite to the intermediate radiator 21, thereby configuring the power terminals 15b projecting from the mold part 10. That is, each of the power terminals 15b is formed by extending part of the intermediate plate 2 in the width direction Y.

Figure 3:
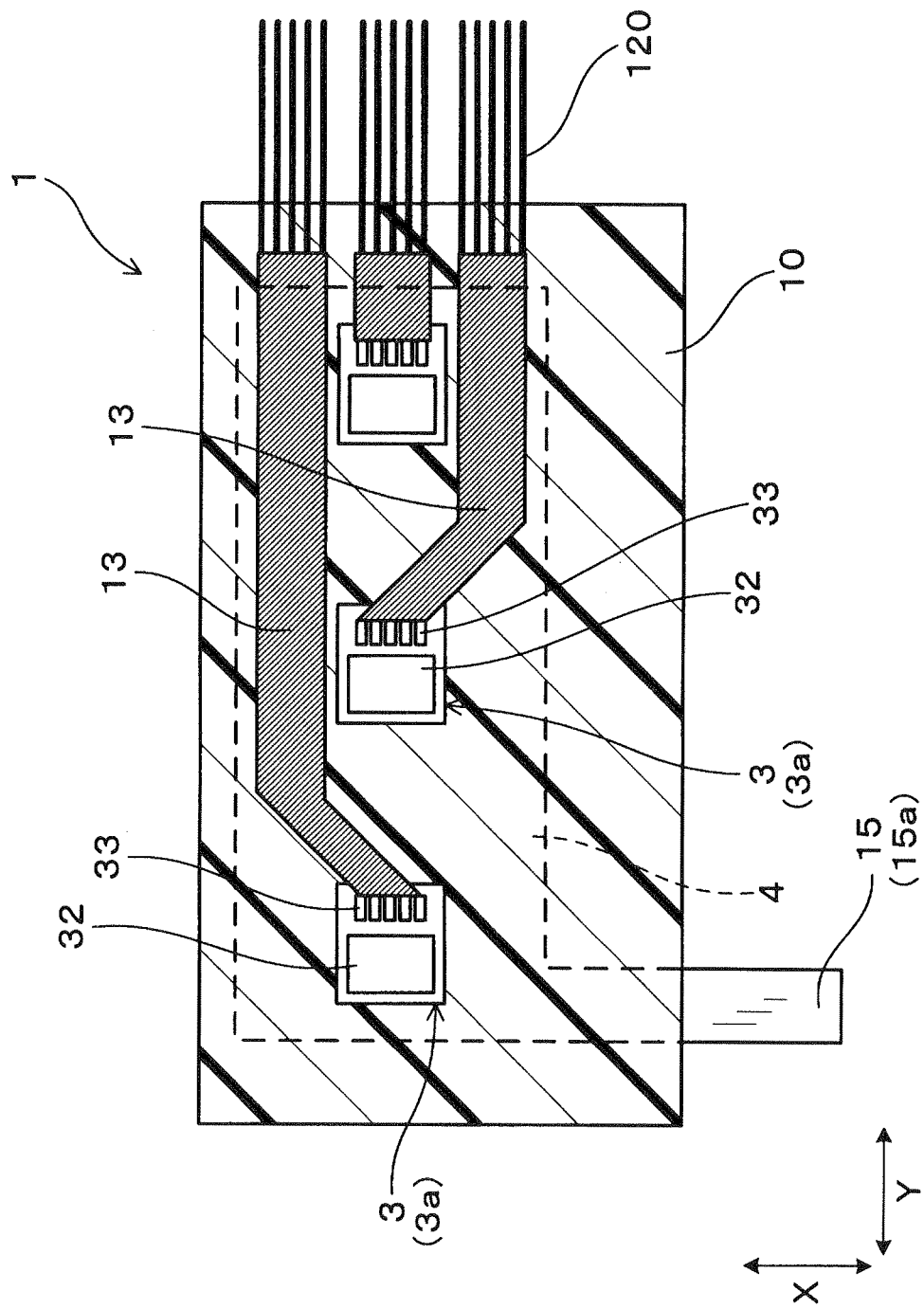
FIG. 3 is a sectional view taken in the direction of arrows III of FIG. 2.

As shown in FIG. 3, each of the pair of heat sinks 4 is a copper plate having a substantial rectangular shape, and is previously applied with nickel plating at areas where the RC-IGBT elements 3 are arranged, as in the case of the intermediate plate 2. In the area where the nickel plating is applied, as shown in FIG. 2, the heat sinks 4 are jointed with the RC-IGBT elements 3 with solder 11. Hence, as shown in FIG. 6, the three series connections 34, each of which is configured with the RC-IGBT elements 3a, 3b and the intermediate plate 2, are connected in parallel.

In addition, as shown in FIG. 4, ends in the projection direction X of the heat sinks 4 configure the power terminals 15a which extend to the side opposite to the intermediate radiator 21 and project from the mold part 10. That is, the power terminals 15a are formed by extending parts in the width direction Y of the heat sinks 4.

Figure 7:
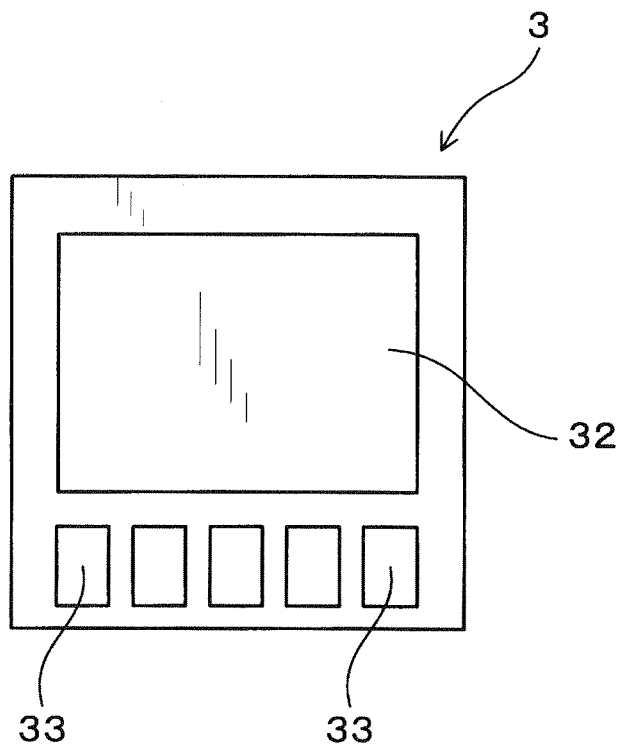
FIG. 7 is a plan view of the power semiconductor element according to the first embodiment.

One main surface of the RC-IGBT element 3, shown in FIG. 7, has an emitter electrode 32 and a plurality of control electrodes 33. The other main surface of the RC-IGBT element 3 has a collector electrode (not shown). The emitter electrode 32 and the collector electrode are, as shown in FIG. 2, joined to the heat sink 4 and the intermediate plate 2 with solder 11, and configure an inverter circuit, as shown in FIG. 6.

As shown in FIGS. 3 and 4, each of the control electrodes 33 is connected to the first control terminal 120 or the second control terminal 121 via a flexible board 13. Thereby, operation of the RC-IGBT elements 3 can be controlled by control signals transmitted to or from the first control terminals 120 and the second control terminals 121. Note that the control electrode 33 includes a gate electrode which controls the gate of the RC-IGBT element 3. The control electrode 33 may include, in addition to the gate electrode, an electrode such as a sensor which detects current, temperature, and the like, as required. In the present embodiment, five control electrodes are provided.

Figure 5:
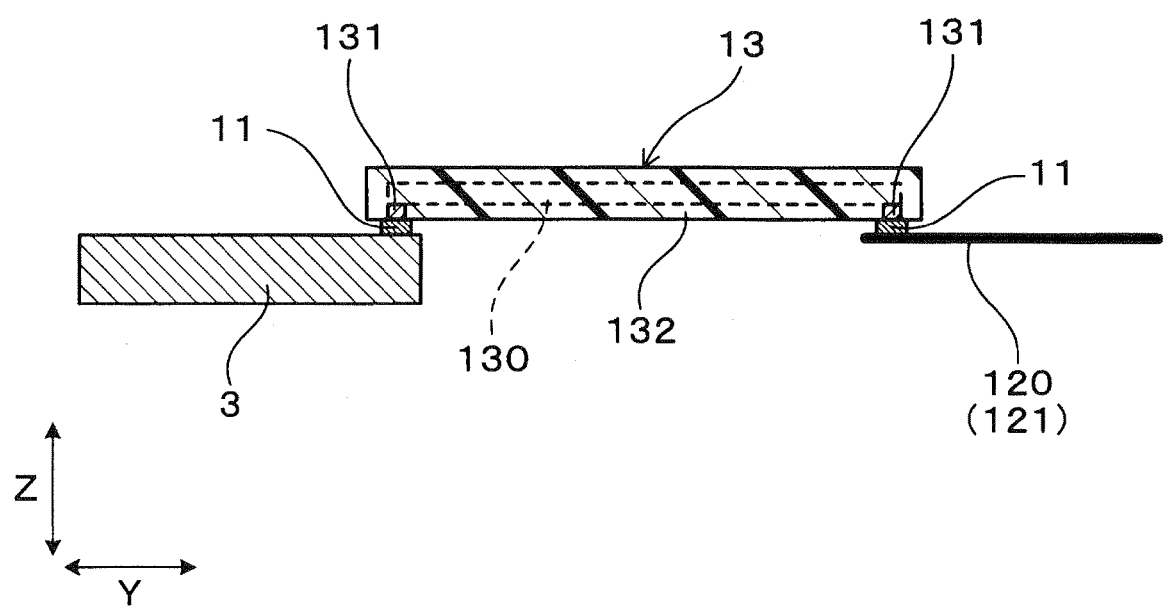
FIG. 5 is a sectional view showing a connecting condition between a power semiconductor element and a flexible board and between a control terminal and the flexible board.

As shown in FIG. 5, the flexible board 13 is configured by burying a conductor 130 in flexible resin 132. Electrode parts 131 are formed by exposing the conductor 130 from the resin at both ends of the flexible board 13. The electrode part 131 formed at one end of the flexible board 13 and the control electrode 33 of the RC-IGBT element 3 are joined with the solder 11. The electrode part 131 formed at the other end of the flexible board 13 and either the first control terminal 120 or the second control terminal 121 are joined with the solder 11. Thereby, as shown in FIG. 3, the three RC-IGBT elements 3a arranged on one main surface 20a, shown in FIG. 2, of the intermediate plate 2 and the first control terminals 120 are connected. In addition, as shown in FIG. 4, the three RC-IGBT elements 3b arranged on the other main surface 20b, shown in FIG. 2, of the intermediate plate 2 and the second control terminals 121 are connected. Note that, in FIGS. 3 and 4, solder is not shown for convenience.

Next, advantages of the present embodiment will be explained. In the semiconductor module 1, each of the RC-IGBT elements 3 is disposed between the intermediate plate 2 and the heat sink 4. Hence, heat generated from the RC-IGBT element 3 can be transferred from the both main surfaces 20 to both of the intermediate plate 2 and the heat sink 4.

In addition, a surface of the heat sink 4 at the side opposite to the RC-IGBT element 3 is exposed from the mold part 10. The intermediate plate 2 has the intermediate radiator 21 projecting in the direction parallel to the main surface 20 from the mold part 10. Hence, the heat sink 4 can radiate heat transferred from the RC-IGBT elements 3 to the outside of the semiconductor module 1 via the exposed part. Similarly, the intermediate plate 2 can radiate heat transferred from the RC-IGBT element 3 to the outside of the semiconductor module 1 via the intermediate radiator 21. As a result, heat removal of the semiconductor module 1 can be improved.

In addition, since an RC-IGBT element 3 is disposed on each of the pair of main surfaces 20 of the intermediate plate 2, the area of the heat sink 4 can be decreased. In addition, a pair of RC-IGBT elements 3 is disposed at the same position when viewed in the thickness direction of the intermediate plate 2. Hence, the RC-IGBT element 3a disposed at the side of one main surface 20a of the intermediate plate 2 and the RC-IGBT element 3b disposed at the side of the other main surface 20b of the intermediate plate 2 are positioned so as to overlap with each other in the projection direction X and the width direction Y. Hence, the area of the intermediate plate 2 required for installing the RC-IGBT element 3 can be decreased, which can miniaturize the intermediate plate 2.

In addition, the semiconductor module 1 includes three RC-IGBT elements 3, each of which is arranged on one main surface 20a of the intermediate plate 2, and three RC-IGBT elements 3, each of which is arranged on the other main surface 20b of the intermediate plate 2. These RC-IGBT elements 3 are connected to one another to form an inverter circuit. The first control terminals 120 and the second control terminals 121 project from the mold part 10 in the directions (width direction Y) parallel to the pair of main surfaces 20 of the intermediate plate 2 and opposite to each other. Hence, the volume of the mold part 10 can be decreased. As a result, the semiconductor module 1 can be further miniaturized.

In addition, the first control terminals 120 and the second control terminals 121, which transmit and receive control signals of the RC-IGBT elements 3, are connected to the RC-IGBT elements 3 via the flexible boards 13. Hence, solder can be used to connect between the flexible boards 13, and the RC-IGBT elements 3, the first control terminals 120 and the second control terminals 121. Hence, jointing the RC-IGBT elements 3 with solder and jointing the flexible board 13 can be simultaneously performed. As a result, assembling the semiconductor module 1 is improved, which can easily manufacture the semiconductor module 1.

As described above, according to the present embodiment, the semiconductor module 1 can be provided which is small in size and has excellent heat removal.

(Second Embodiment)

In the present embodiment, material of the intermediate plate 2 according to the first embodiment is changed to that having anisotropy in thermal conductivity. In the present embodiment, the intermediate plate 2 is configured by forming graphite into a plate, on a surface of which nickel plating is applied. Other configurations are the same as those of the first embodiment.

Graphite has a structure in which a number of planar graphene sheets structured of carbon atoms are laminated. The thermal conductivity of graphite in the direction parallel to the graphene sheets is higher than that in the direction in which the graphene sheets are laminated. A typically known value of the thermal conductivity of graphite in the direction in which the graphene sheets are laminated and that in the direction parallel to the graphene sheets are 3 W/m·k and 1700 W/m·k, respectively.

Figure 8:
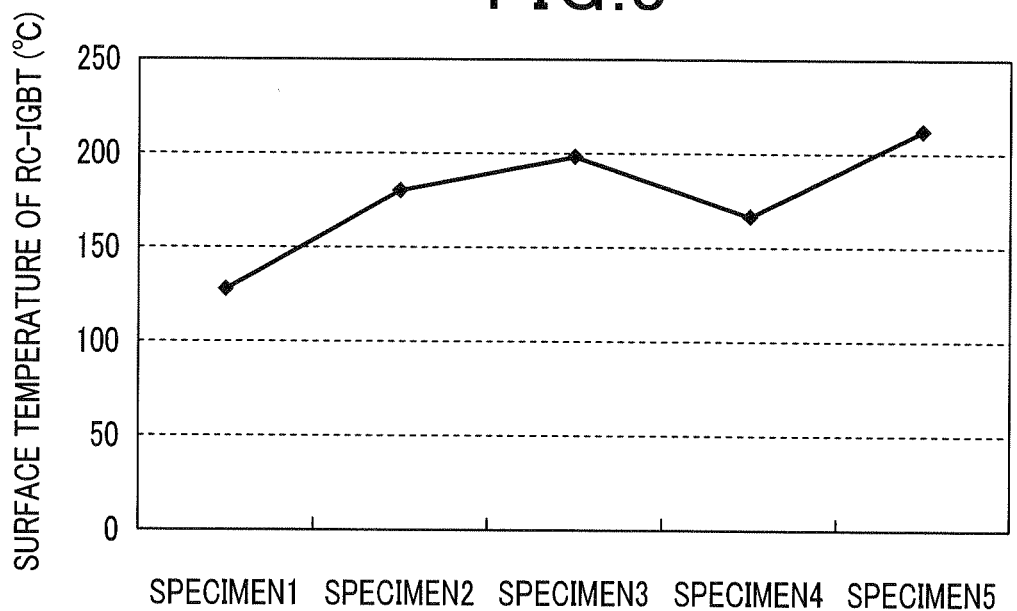
FIG. 8 is a diagram for explaining heat removal of a power semiconductor element when using an intermediate plate having anisotropy in thermal conductivity, according to a second embodiment.

FIG. 8 shows a result of simulation regarding heat removal of the intermediate radiator when thermal conductivity in the projection direction X, the width direction Y and the thickness direction Z is changed as shown in a table 1. Note that the vertical axis of FIG. 8 indicates temperature in a steady state of the RC-IGBT element 3 when calculation is performed under the following condition.

The simulation is performed for one pair of RC-IGBT elements 3 of the three pairs of RC-IGBT elements 3 shown in FIG. 2, under the following condition. One pair of RC-IGBT elements 3 is arranged on the intermediate plate 2 as heat sources which generate the amount of heat corresponding to that generated during normal operation. Then, surface temperature, in a steady state of the RC-IGBT element 3 when a constant amount of heat is radiated from the intermediate radiator 21, is analyzed.

Figure 9:
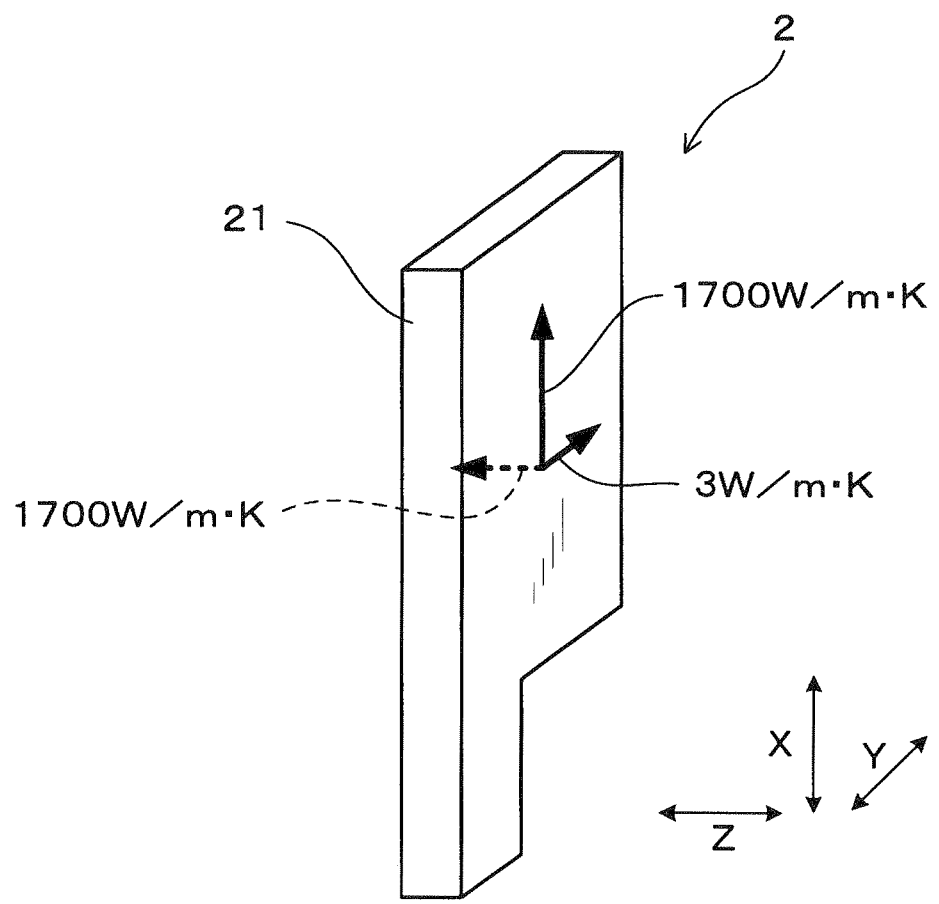
FIG. 9 is a perspective view of the intermediate plate having anisotropy in thermal conductivity, according to the second embodiment.

In the table 1, specimens 1 to 3 are models of graphite having lower thermal conductivity in the width direction Y, the thickness direction Z, and the projection direction X, respectively. As a typical example, FIG. 9 shows thermal conductivity in each direction of the intermediate plate corresponding to the specimen 1. The specimen 4 is a model of copper whose thermal conductivity in each direction is set to 400 W/m·k. The specimen 5 is a model in which the intermediate plate does not project from the mold part, and the intermediate radiator is not provided, and whose thermal conductivity in each direction is set to 0 W/m·k.

TABLE 1

| Specimen No. | Material | Thermal conductivity (W/m · k) | | | RC-IGBT Surface temperature (° C.) |
| --- | --- | --- | --- | --- | --- |
| | | Projection direction X | Width direction Y | Thickness direction Z | |
| Specimen1 | Graphite | 1700 | 3 | 1700 | 128 |
| Specimen2 | Graphite | 1700 | 1700 | 3 | 180 |
| Specimen3 | Graphite | 3 | 1700 | 1700 | 198 |
| Specimen4 | Copper | 400 | 400 | 400 | 166 |
| Specimen5 | (No intermediate radiator) | 0 | 0 | 0 | 212 |

The intermediate plates 2 related to the specimens 1 and 2 have anisotropy in thermal conductivity. As seen from the table 1, thermal conductivity in the projection direction X is higher than thermal conductivity in the width direction Y. Hence, as seen from FIG. 8, heat generated from the RC-IGBT element 3 can be easily transferred toward the intermediate radiator 21. As a result, heat removal of the semiconductor module 1 can be further improved.

Furthermore, as seen from the table 1, the intermediate plate 2 related to the specimen 1 has thermal conductivity in the thickness direction Z higher than thermal conductivity in the width direction Y. Hence, heat generated from the RC-IGBT element 3 is diffused in the thickness direction Z from the main surface of the intermediate plate and is easily diffused in the projection direction X of the intermediate plate 2. Thereby, as seen from FIG. 8, heat can be easily transferred from the RC-IGBT element 3 toward the intermediate radiator 21. Then, the heat transferred to the intermediate radiator 21 is further diffused in the thickness direction Z. Hence, heat can be easily removed to the outside of the intermediate radiator 21. As a result, heat removal of the semiconductor module 1 can be further improved. The present embodiment can provide other advantages similar to those of the first embodiment.

(Third Embodiment)

Figure 10:
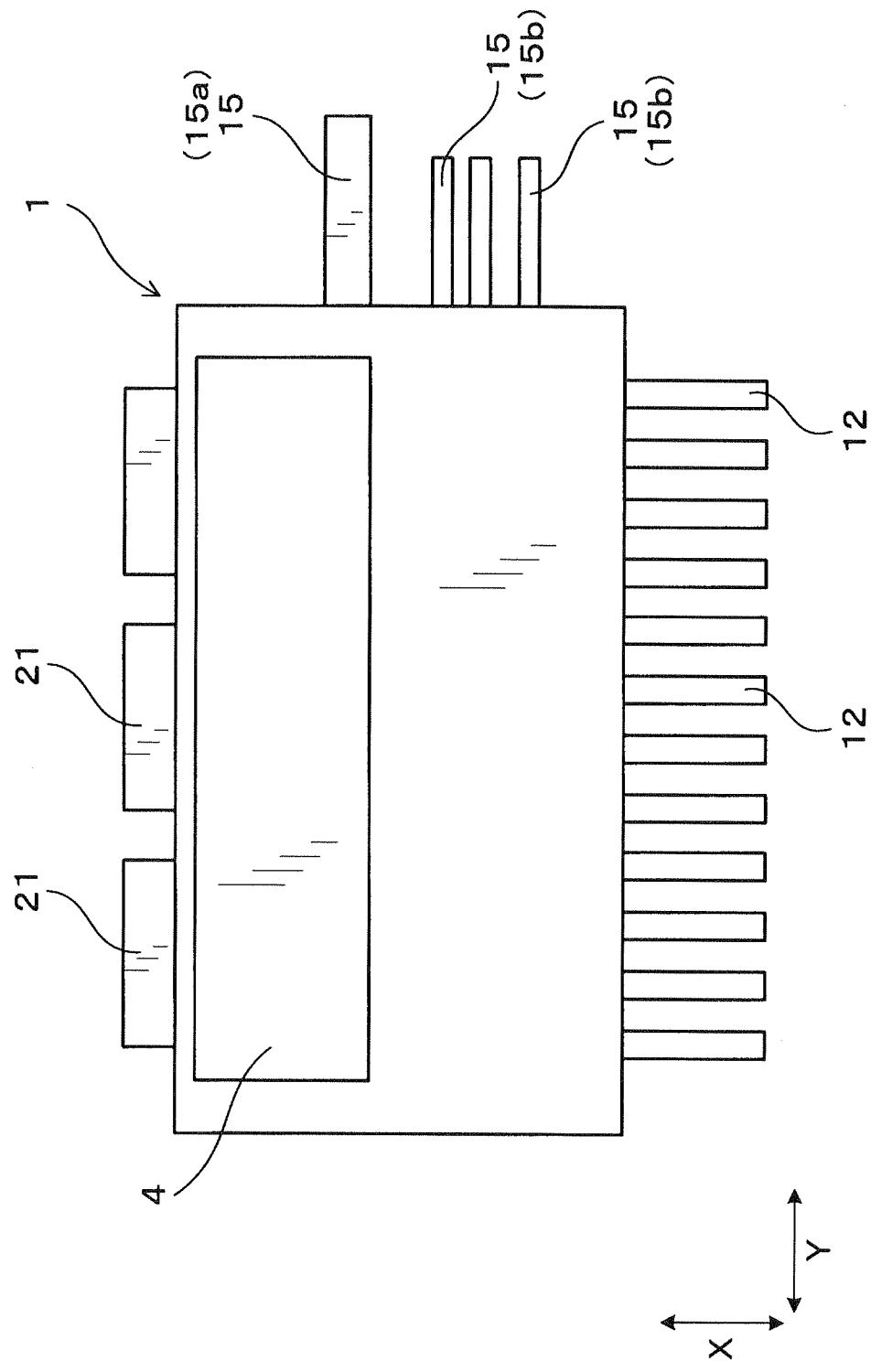
FIG. 10 is a plan view of a semiconductor module in which power semiconductor elements and control terminals are connected via bonding wires, according to a third embodiment.

In the present embodiment, the connection between the RC-IGBT element 3 and the control terminal is performed by using wire bonding. As shown in FIG. 10, in the semiconductor module 1 of the present embodiment, control terminals 12 are arranged on the surface at the side opposite to the intermediate radiators 21. A plurality of power terminals 15 are arranged on one surface in the width direction Y.

Figure 11:
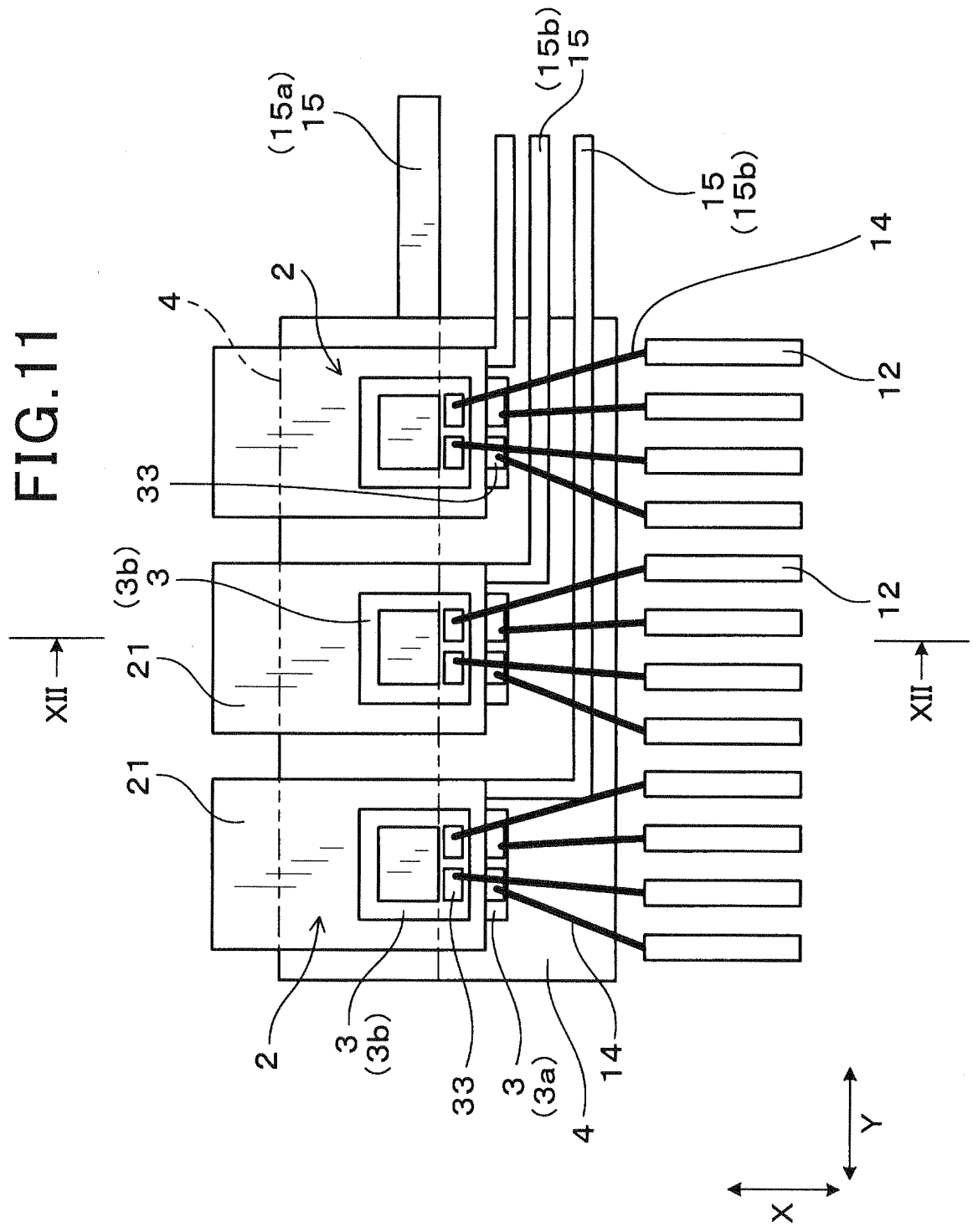
FIG. 11 is a sectional view of the semiconductor module in which power semiconductor elements and control terminals are connected via bonding wires, according to the third embodiment (sectional view corresponding to FIG. 4)

As shown in FIG. 11, inside the semiconductor module 1, one end portion in projection direction X of each of the intermediate plates 2 is extended in the direction opposite to the intermediate radiator 21 from the end face at the side opposite to the intermediate radiator 21. The extended parts are bent in the width direction Y so as not contact each other in the mold part 10, and are further extended in the width direction Y. The extended parts project from one surface in the width direction Y of the mold part 10 to the outside of the mold part 10, thereby forming the power terminals 15*b*. Note that, in FIG. 11, the mold part 10 is not shown for convenience.

In addition, as shown in FIG. 11, each part of a pair of heat sinks 4 at the side of the intermediate radiator 21 with respect to the three power terminals 15*b* is extended in the width direction Y from one end face in the width direction Y. The extended part projects from the mold part 10, thereby forming the power terminal 15*a* shown in FIG. 10.

As shown in FIG. 11, the RC-IGBT element 3*a* disposed at the side of one main surface 20*a* of the intermediate plate 2 has a projection area projecting to the side of the control terminals 12 with respect to the intermediate plate 2 when viewed in the thickness direction Z. The projection area is provided with the control electrodes 33 serving as bonding pads. The control electrodes 33 and the control terminals 12 are connected via bonding wires 14. Note that, in the present embodiment, each of the RC-IGBT elements 3 is provided with two control electrodes 33.

Figure 12:
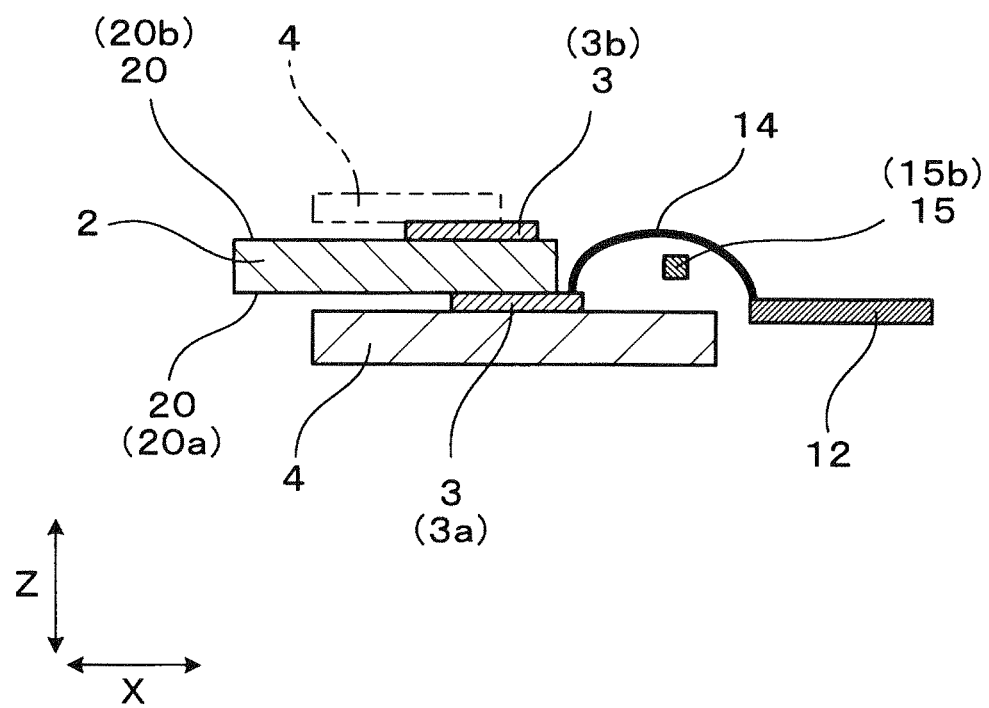
FIG. 12 is a sectional view taken in the direction of arrows XII of FIG. 11.

As shown in FIG. 12, the bonding wire 14 is wired so as to step over the power terminal 15*b* extending from the intermediate plate 2 when viewed in the width direction Y. That is, the bonding wire 14 is wired in a substantial arc shape having a top at the side of the other main surface 20*b* of the intermediate plate 2. The bonding wire 14 is disposed so that the power terminal 15*b* passed between the heat sink 4 at the side of one main surface 20*a* of the intermediate plate 2 and the bonding wire 14.

In addition, as shown in FIG. 11, the RC-IGBT element 3*b* disposed at the side of the other main surface 20*b* of the intermediate plate 2 has a projection area projecting to the side of the control terminals 12 with respect to the heat sink 4 disposed at the side of the other main surface 20*b* of the intermediate plate 2 when viewed in the thickness direction Z. The projection area is provided with the control electrodes 33 serving as bonding pads, as in the case described above. The control electrodes 33 and the control terminals 12 are connected via bonding wires 14. Other configurations are the same as those of the first embodiment. Note that, in FIGS. 10, 11 and 12, reference numerals same as those used in the first embodiment show the same elements or the like as those of the first embodiment, unless otherwise specified.

Next, advantages of the present embodiment will be described. In the present embodiment, the RC-IGBT element 3 disposed at the side of one main surface of the intermediate plate 2 has a projection area projecting to the outside of the intermediate plate 2 when viewed in the thickness direction Z of the intermediate plate 2. The RC-IGBT element 3 is connected to the control terminals 12 by the bonding wires 14 on the control electrodes 33 serving as bonding pads formed in the projection area. Hence, the connection between the RC-IGBT element 3 and the control terminals 12 can be performed at low cost. The present embodiment can provide other advantages similar to those of the first embodiment.

(Fourth Embodiment)

Figure 13:
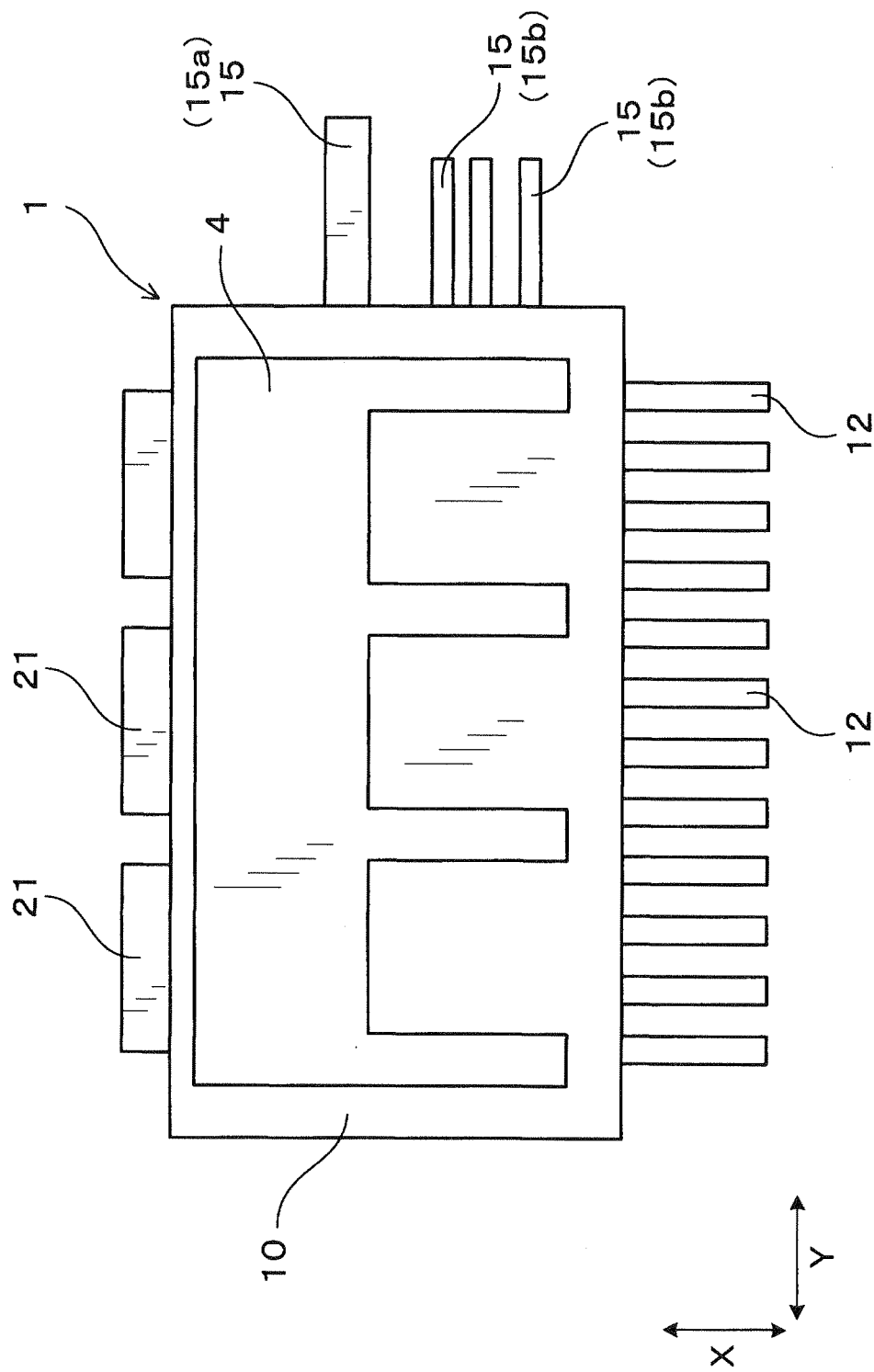
FIG. 13 is a plan view of a semiconductor module according to a fourth embodiment.
Figure 14:
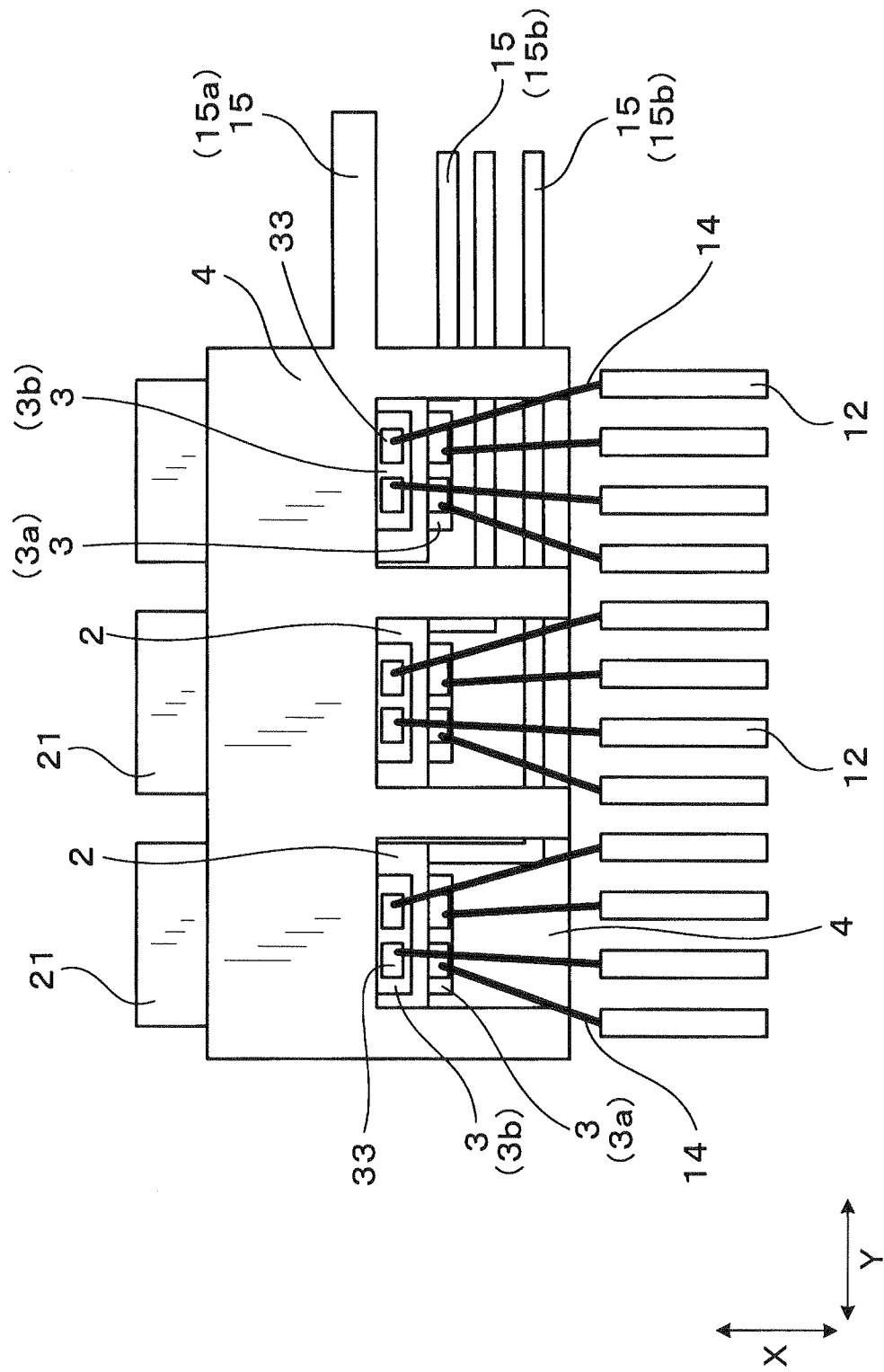
FIG. 14 is a sectional view of the semiconductor module (sectional view corresponding to FIG. 4), according to the fourth embodiment.

The present embodiment modifies the shape of the heat sink 4 disposed at the side of the other main surface 20*b* of the intermediate plate 2. As shown in FIGS. 13 and 14, the heat sink 4 of the present embodiment is disposed so as to avoid (so as not to overlap with) the areas where the bonding wires 14 are arranged when viewed in the thickness direction Z of the intermediate plate 2. That is, parts of the heat sink 4 extending in the projection direction X from the end face at the side opposite to the intermediate radiator 21 of the intermediate plate 2 are formed so as not to overlap with the areas where the bonding wires 14 are arranged when viewed in the thickness direction Z. Other configurations are the same as those of the third embodiment. Note that, in FIGS. 13 and 14, reference numerals same as those used in the third embodiment show the same elements or the like as those of the third embodiment, unless otherwise specified.

In the present embodiment, as described above, since the heat sink 4 is disposed so as to avoid (so as not to overlap with) the area where the bonding wires 14 are arranged, the connection between the bonding wires 14 and the control terminals 12 can be performed after the intermediate plates 2, the RC-IGBT elements 3, and the pair of heat sinks 4 are assembled. As a result, flexibility in a process of fabricating the semiconductor module 1 increases, which can easily produce the semiconductor module 1. In addition, since the area of the heat sink of the present embodiment is larger than that of the third embodiment, heat removal of the semiconductor module 1 can be improved. The present embodiment can provide other advantages similar to those of the third embodiment.

(Fifth Embodiment)

Figure 15:
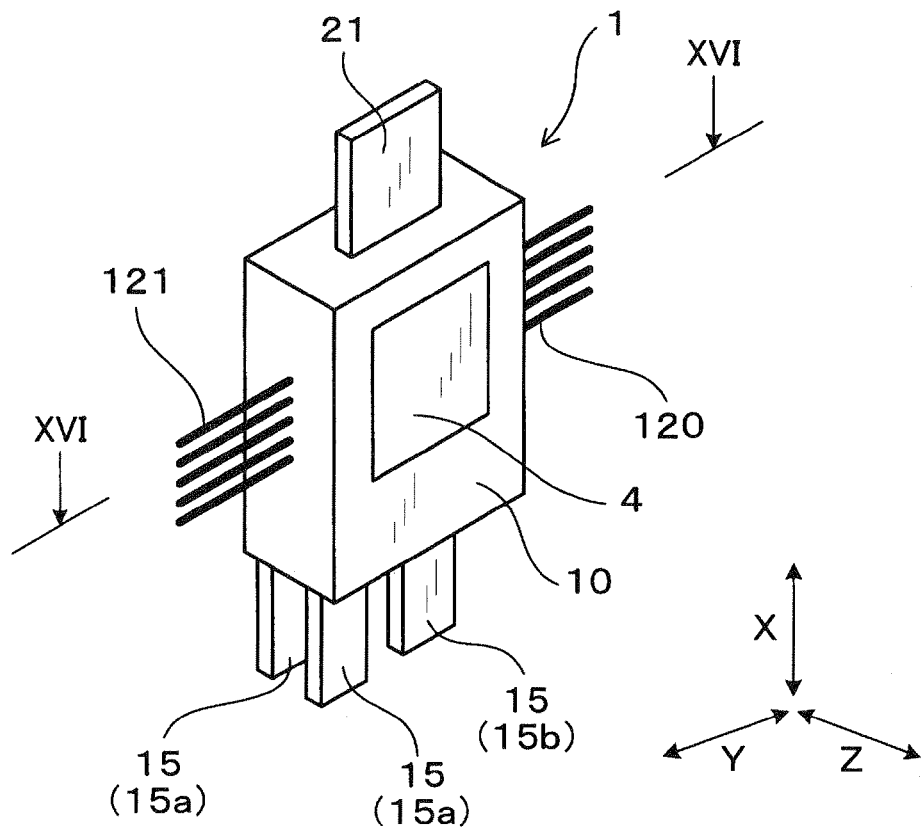
FIG. 15 is a plan view of a semiconductor module which includes a pair of power semiconductor elements, according to a fifth embodiment.
Figure 16:
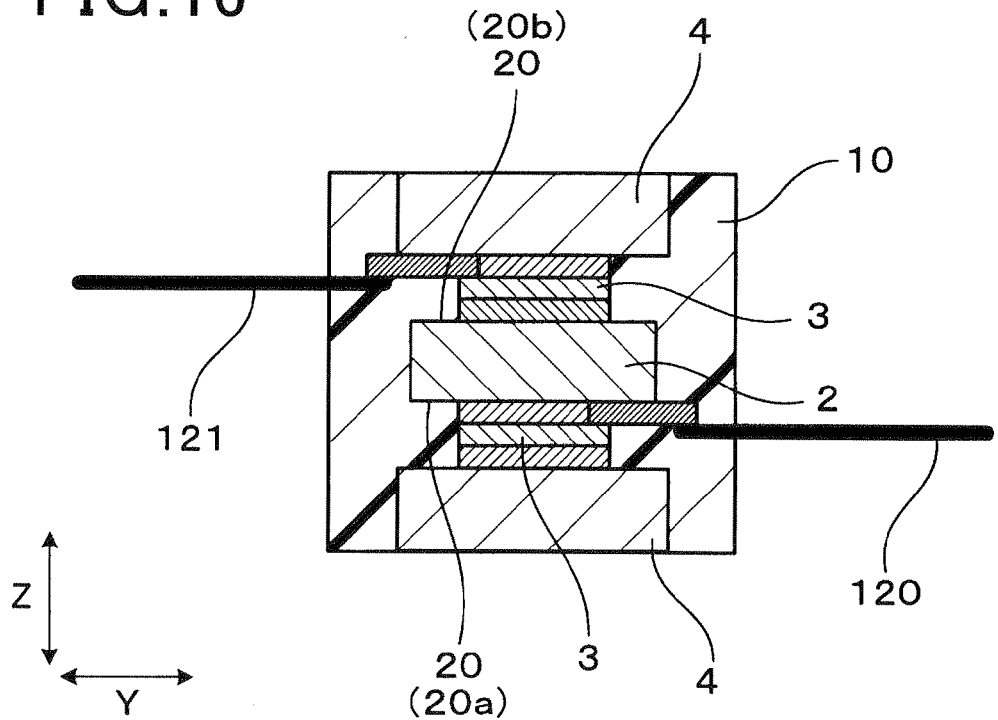
FIG. 16 is a sectional view taken in the direction of arrows XVI of FIG. 15.

In the present embodiment, the numbers of the RC-IGBT elements 3 and the intermediate plates 2 arranged on the semiconductor module 1 of the first embodiment are changed. As shown in FIGS. 15 and 16, in the semiconductor module 1 of the present embodiment, one RC-IGBT element 3 is disposed on each of the pair of main surfaces 20 of one intermediate plate 2. Other configurations are the same as those of the first embodiment. Note that, in FIGS. 15 and 16, reference numerals same as those used in the first embodiment show the same elements or the like as those of the first embodiment, unless otherwise specified.

In the embodiments 1 to 4, the semiconductor module 1 including six RC-IGBT elements 3 is described. In addition to that, for example, a half-bridge type or full-bridge type converter circuit can be configured by using the semiconductor module 1 of the present embodiment. The present embodiment can provide other advantages similar to those of the first embodiment.

(Sixth Embodiment)

Figure 17:
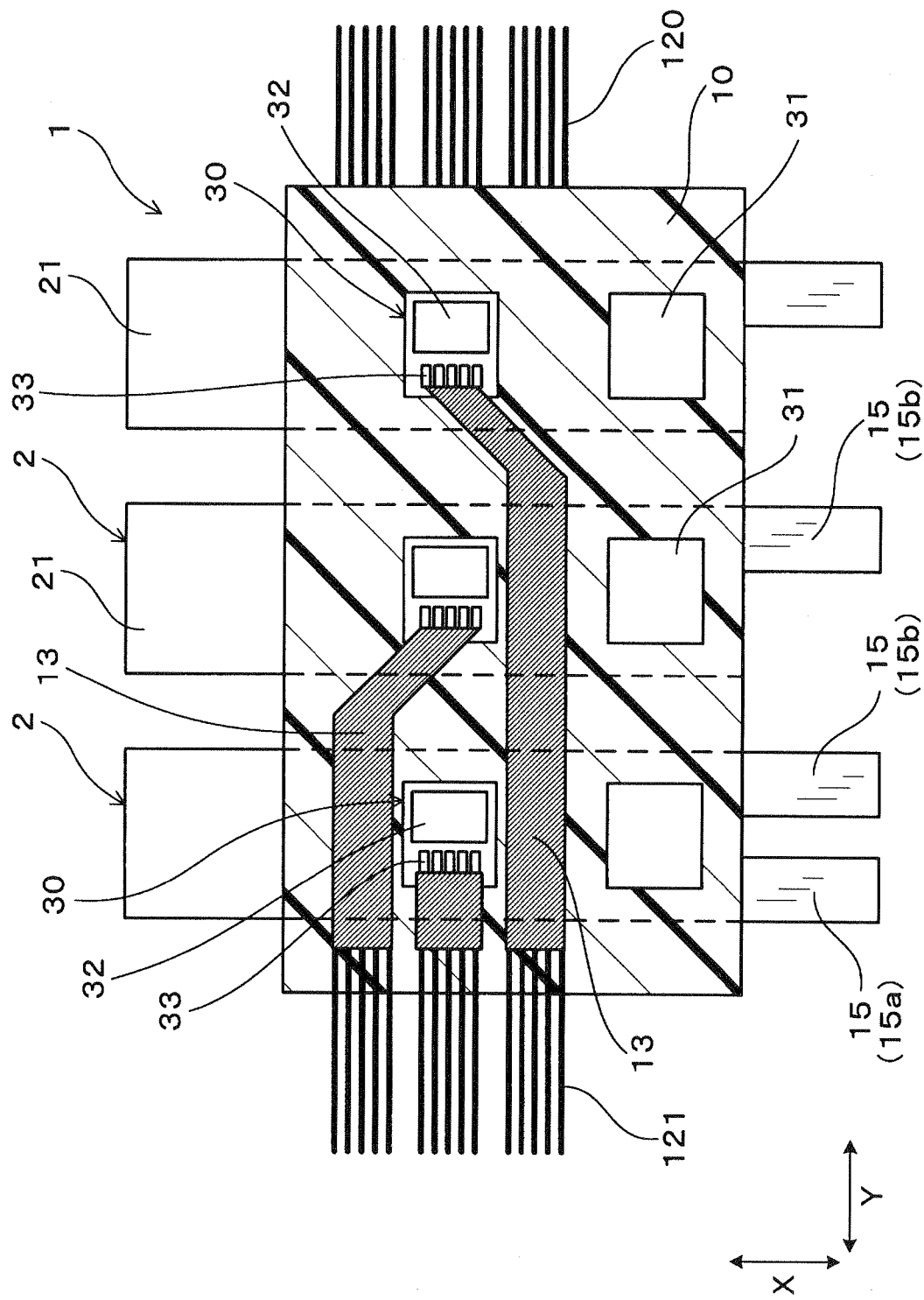
FIG. 17 is a sectional view of a semiconductor module which includes power semiconductor elements and diode elements (sectional view corresponding to FIG. 4), according to a sixth embodiment.

The present embodiment uses IGBT (Insulated Gate Bipolar Transistor) elements as power semiconductor devices. In the semiconductor module 1 of the present embodiment, as shown in FIG. 17, a set of IGBT element 30 and FWD (Free Wheeling Diode) 31 is arranged on each of the main surfaces of the intermediate plates 2. Other configurations are the same as those of the first embodiment. Note that, in FIG. 17, reference numerals same as those used in the first embodiment show the same elements or the like as those of the first embodiment, unless otherwise specified.

In the embodiments 1 to 4, the semiconductor module 1 including RC-IGBT elements 3 serving as power semiconductor devices is described. In addition to that, for example, the IGBT element 30 and the FWD 31 can be combined. The present embodiment can provide advantages similar to those of the first embodiment.

In addition to that, as a power semiconductor device, a MOSFET (Metal-Oxide Semiconductor Field-Effect Transistor) or the like can be used.

(Seventh Embodiment)

Figure 18:
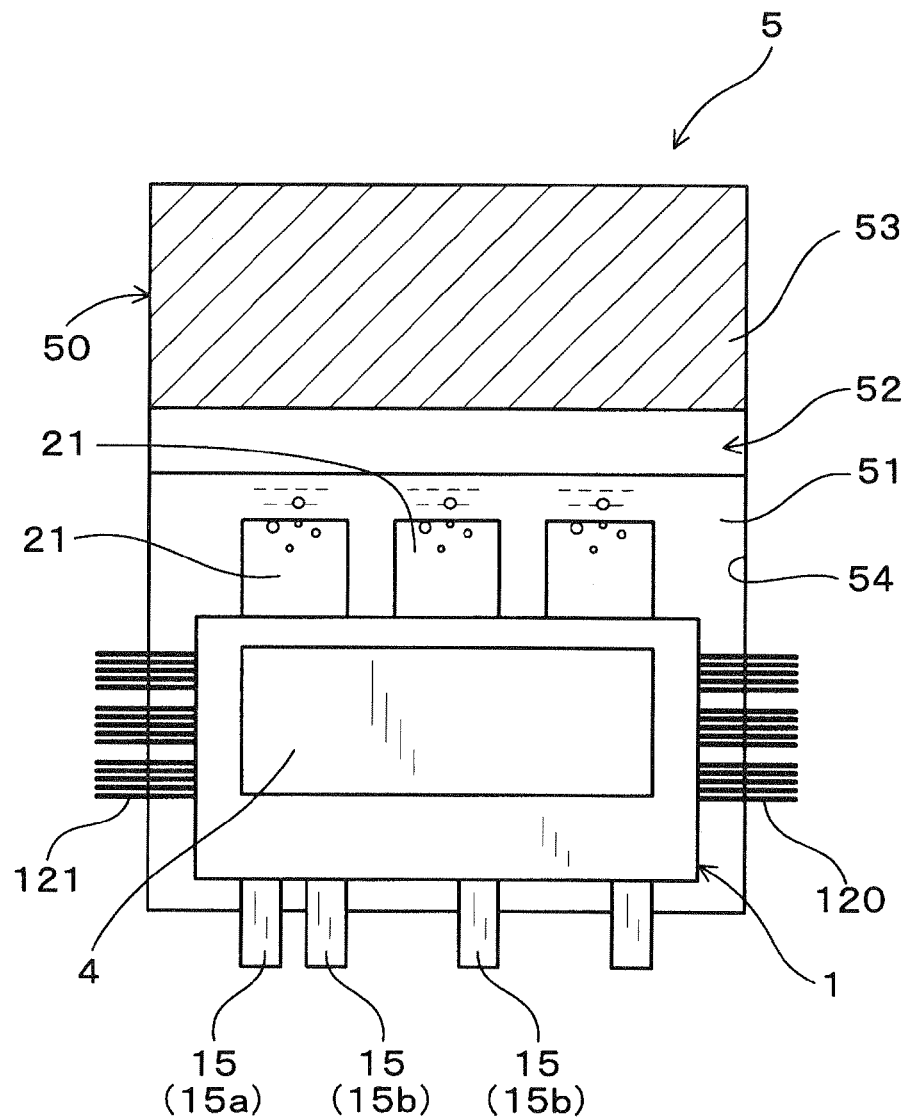
FIG. 18 is a plan view of a semiconductor device viewed from the side of a heat sink of a semiconductor module, according to a seventh embodiment.

In the present embodiment, as shown in FIG. 18, a semiconductor device 5 has the semiconductor module 1 of the first embodiment and an evaporative cooler 50. In the semiconductor device 5, the semiconductor module 1 is disposed inside the evaporative cooler 50 having a substantial rectangular parallelepiped shape. In addition, a plurality of power terminals 15, first control terminals 120, and second control terminals 121 are drawn to the outside of the evaporative cooler 50.

As shown in FIG. 18, the evaporative cooler 50 includes a boiling part 52 and a condenser 53 disposed above the boiling part 52. The boiling part 52 brings the semiconductor module 1 into contact with refrigerant liquid 51 to evaporate the refrigerant liquid 51 by heat generated from the semiconductor module 1. The condenser 53 condenses the vapor of the refrigerant liquid 51 generated by the boiling part 52.

As shown in FIG. 18, the boiling part 52 encloses the semiconductor module 1 and the refrigerant liquid 51. The semiconductor module 1 is disposed so that the intermediate radiator 21 extends upward, that is, toward the boiling part 52. In addition, the refrigerant liquid 51 is filled so that the intermediate radiator 21 of the intermediate plate 2 in the semiconductor module 1 is immersed in the refrigerant liquid 51. Note that, as the refrigerant liquid 51, a liquid serving as electric insulation can be used, such as fluorinert (trademark) or HFC (Hydrofluorocarbon).

In addition, a plurality of power terminals 15, first control terminals 120, and second control terminals 121 drawn from the boiling part 52 to the outside of the evaporative cooler 50 project from the semiconductor module 1 in the direction which differs from the direction in which the intermediate radiator 21 projects. That is, in the semiconductor device 5, the power terminals 15 project downward. The first control terminals 120 and the second control terminals 121 project in the horizontal direction and the directions opposite to each other. In addition, portions where the power terminals 15, the first control terminals 120, and the second control terminals 121 contact wall surfaces 54 of the boiling part 52 are sealed by using airtight terminals or the like so that the refrigerant liquid 51 does not leak.

Figure 19:
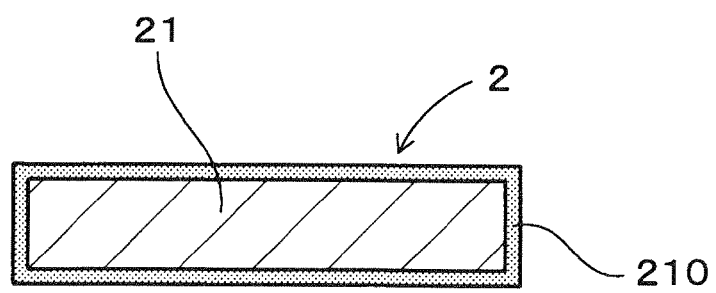
FIG. 19 is a sectional view in the horizontal direction of an intermediate radiator, on a surface of which a porous layer is provided, according to the seventh embodiment.

As shown in FIG. 19, in the semiconductor module 1 of the present embodiment, a porous layer 210 is formed on a surface of the intermediate radiator 21. The porous layer 210 can be formed by, for example, performing thermal spraying of minute metal particles such as copper for the exposed portions of the heat sink 4. Other advantages of the present embodiment are similar to those of the first embodiment. Note that, in FIGS. 18 and 19, reference numerals same as those used in the first embodiment show the same elements or the like as those of the first embodiment, unless otherwise specified.

Next, advantages of the present embodiment will be explained. If the semiconductor module 1 is disposed inside the evaporative cooler 50, heat transferred from the RC-IGBT elements 3 to the pair of heat sinks 4 and the intermediate radiators 21 is transferred to the refrigerant liquid 51 which contacts the heat sinks 4 and the intermediate radiators 21. Then, at least part of the refrigerant liquid 51 evaporates. Thereby, the heat transferred to the heat sinks 4 and the intermediate radiators 21 can be efficiently removed as heat of vaporization of the refrigerant liquid 51.

In addition, the power terminals 15, the first control terminals 120, and the second control terminals 121 project from the mold part 10 in the direction which differs from the direction in which the intermediate radiators 21 project. In addition, the semiconductor module 1 is disposed so that the intermediate radiators 21 extend upward. Hence, bubbles of the refrigerant liquid 51 generated from the portions where the heat sinks 4 and the intermediate radiators 21 contact the refrigerant liquid 51 are not prevented from rising by the semiconductor module 1 or the power terminals and the control terminals. As a result, the refrigerant liquid 51 can be supplied to the pair of heat sinks 4 and the intermediate radiators 21 without delay. Hence, heat removal of the semiconductor module 1 can be improved.

In addition, the porous layer 210 is formed on the surface of the intermediate radiator 21. Hence, since the refrigerant liquid 51 can penetrate into the porous layer 210, the area where the refrigerant liquid 51 contacts the intermediate radiator 21 increases, which can efficiently perform heat exchange. As a result, heat removal of the semiconductor module 1 can be further improved.

As described above, according to the semiconductor device 5 of the present embodiment, heat removal of the semiconductor module 1 can be significantly improved.

(Eighth Embodiment)

Figure 20:
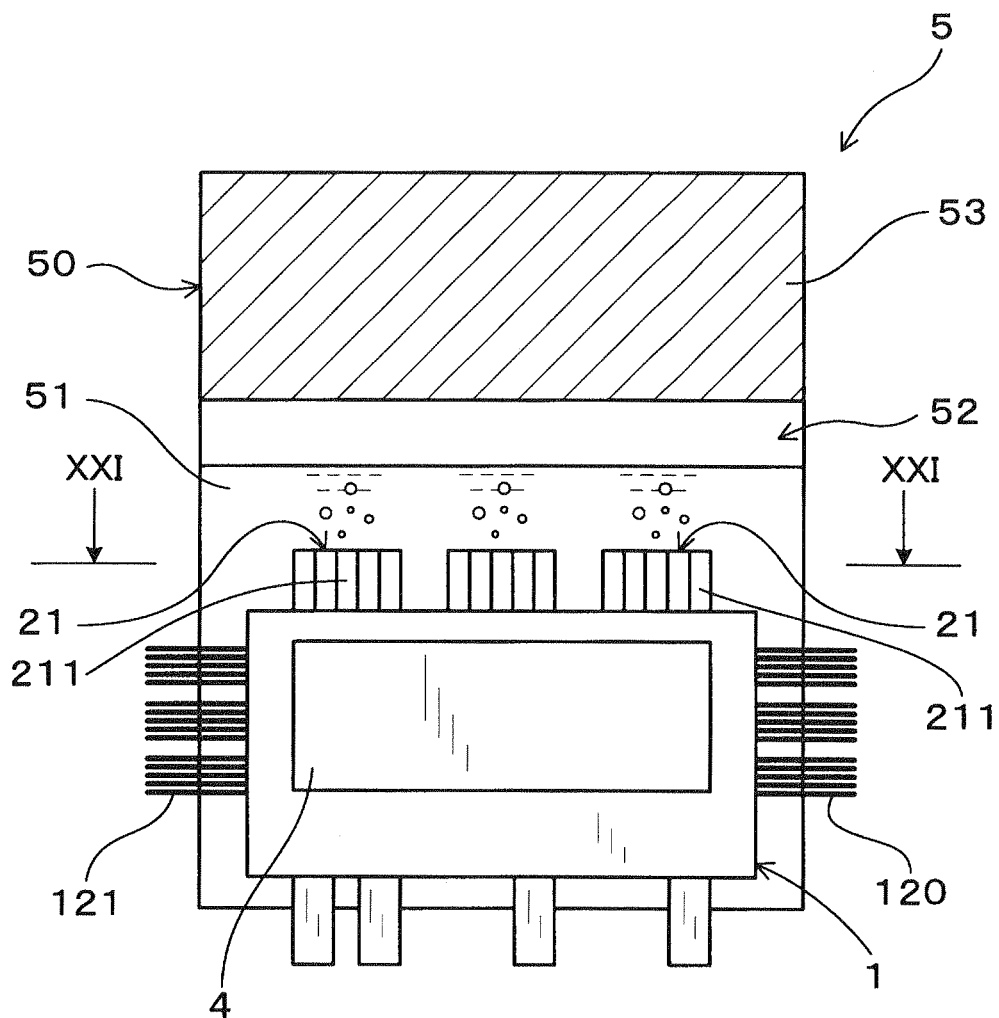
FIG. 20 is a plain view of a semiconductor module viewed from the side of a heat sink thereof, the semiconductor module having an intermediate radiator, on a cross section of which comb tooth parts are provided, according to an eighth embodiment.
Figure 21:
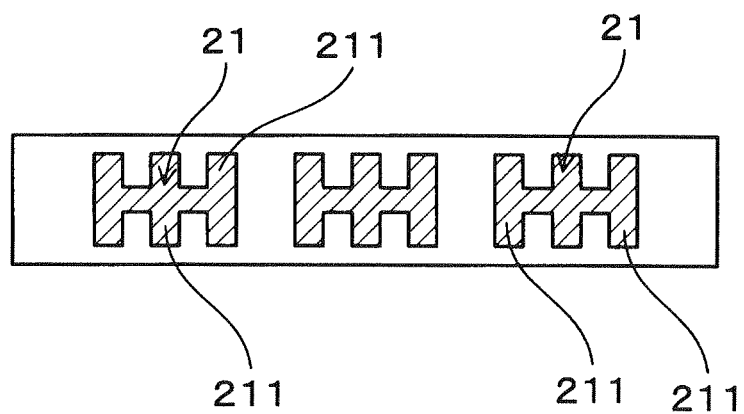
FIG. 21 is a sectional view taken in the direction of arrows XXI of FIG. 20.

In the present embodiment, the shape of the intermediate radiator 21 of the semiconductor module 1 according to the seventh embodiment is changed so that the area where the intermediate radiator 21 contacts the refrigerant liquid 51 increases. As shown in FIGS. 20 and 21, the intermediate radiators 21 of the present embodiment have equal cross-sectional shapes perpendicular to the projection directions of the intermediate radiators 21. Each of the cross-sectional shapes has comb tooth parts 211. That is, the intermediate radiator 21 has a base extending in the projection direction X from the intermediate plate 2 buried in the mold part 10, and the comb tooth parts 211 which stand in the thickness direction Z form the base. Other configurations of the present embodiment are the same as those of the seventh embodiment. Note that, in FIGS. 20 and 21, reference numerals same as those used in the seventh embodiment show the same elements or the like as those of the seventh embodiment, unless otherwise specified.

Hence, bubbles of the refrigerant liquid 51 generated from the intermediate radiators 21 having equal cross-sectional shapes can rise without being prevented by the intermediate radiator 21. In addition, since the surface area of the intermediate radiator 21 increases due to the comb tooth parts, heat exchange can be efficiently performed between the intermediate radiators 21 and the refrigerant liquid 51. As a result, heat removal of the semiconductor module 1 can be further improved. The present embodiment can provide advantages similar to those of the seventh embodiment.

Figure 22:
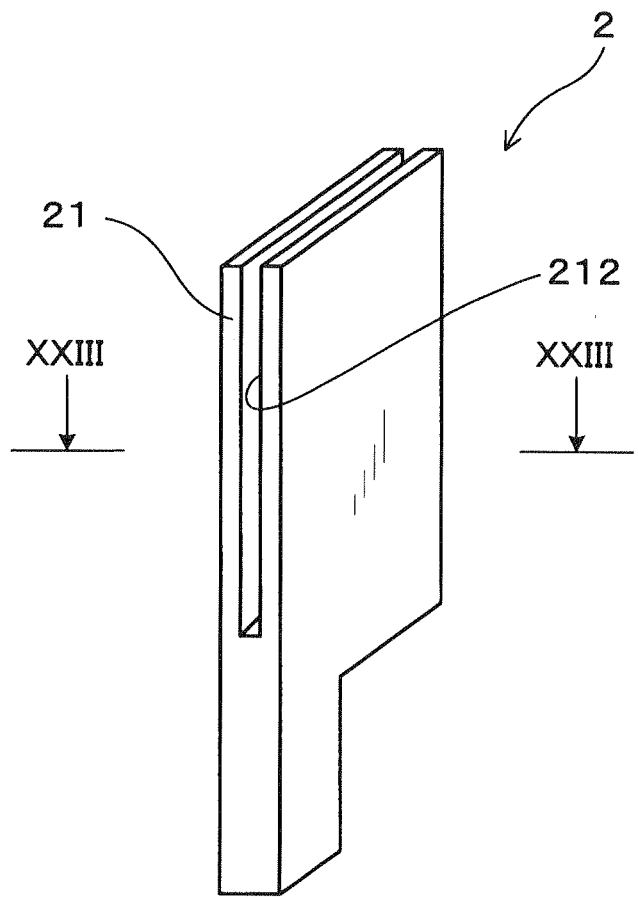
FIG. 22 is a perspective view of an intermediate plate in which a notched part is provided between a pair of main surfaces, according to the eighth embodiment.
Figure 23:
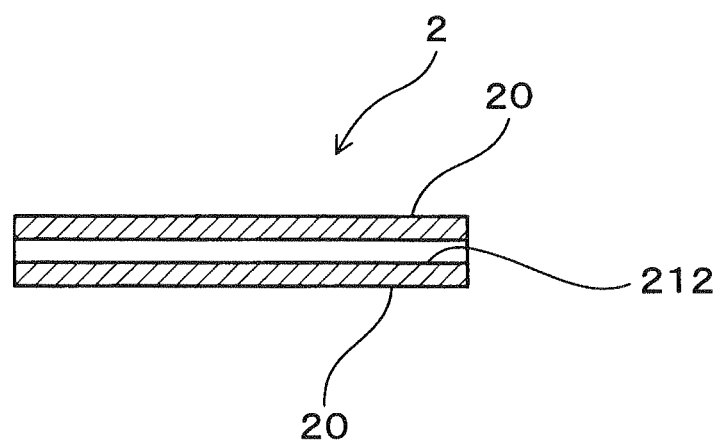
FIG. 23 is a sectional view taken in the direction of arrows XXIII of FIG. 22.

Note that, in addition to the comb tooth parts 211, as shown in FIGS. 22 and 23, a notched part 212, which is formed in parallel to the main surfaces 20, may be provided between the pair of main surfaces 20 of the intermediate plate 2. Hence, the area where the intermediate radiator 21 contacts the refrigerant liquid 51 can be increased, which improves heat removal of the semiconductor module 1.

(Ninth Embodiment)

Figure 24:
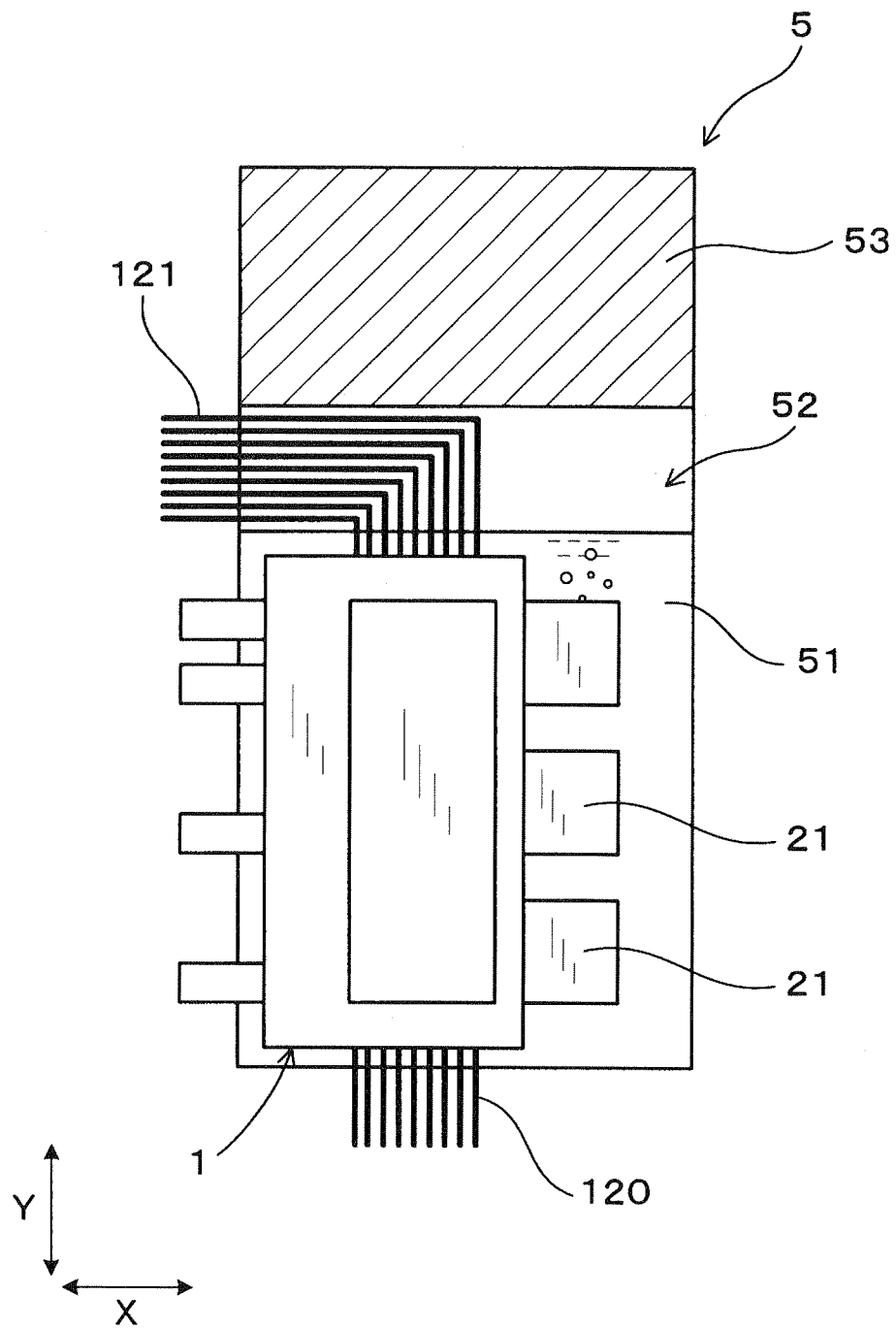
FIG. 24 is a sectional view of a semiconductor device in which intermediate radiators are arranged in the horizontal direction, according to a ninth embodiment.

The present embodiment modifies the arrangement of the semiconductor module 1 according to the seventh embodiment. In the semiconductor device 5 of the present embodiment, as shown in FIG. 24, the semiconductor module 1 is disposed so that the intermediate radiators 21 extend in the horizontal direction. That is, the semiconductor module 1 is disposed so that the width direction Y thereof agrees with the upward direction, and both the projection direction X and the thickness direction Z thereof agree with the horizontal direction. In addition, the second control terminals 121 projecting upward from the mold part 10 are bent in the horizontal direction and in the direction opposite to the intermediate radiators 21. Hence, a plurality of power terminals 15, first control terminals 120, and second control terminals 121 are arranged so as not to overlap with the intermediate radiators 21 when viewed from above. Other configurations of the present embodiment are the same as those of the seventh embodiment. Note that, in FIG. 24, reference numerals same as those used in the seventh embodiment show the same elements or the like as those of the seventh embodiment, unless otherwise specified.

Even when the intermediate radiators 21 of the semiconductor module 1 are arranged in the horizontal direction, bubbles of the refrigerant liquid 51 generated from the intermediate radiators 21 can rise without being prevented by the semiconductor module 1. In addition, since a plurality of power terminals and a plurality of control terminals are arranged so as not to overlap with the intermediate radiators 21 when viewed from above, these terminals do not prevent the bubbles of the refrigerant liquid 51 from rising. As a result, heat removal of the semiconductor module 1 can be further improved. The present embodiment can provide advantages similar to those of the seventh embodiment.

(Tenth Embodiment)

Figure 25:
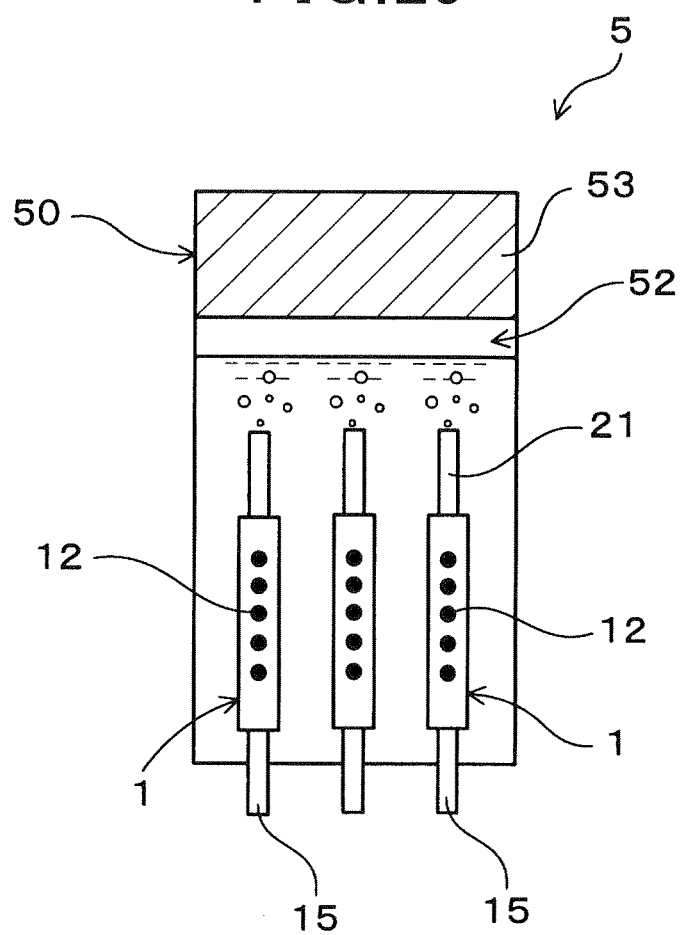
FIG. 25 is a sectional view of a semiconductor device which uses a plurality of semiconductor modules, according to a tenth embodiment.

In the present embodiment, as shown in FIG. 25, in a semiconductor device 5, a plurality of semiconductor modules 1 are arranged in the evaporative cooler 50. In the semiconductor device 5 of the present embodiment, three semiconductor modules 1 of the fifth embodiment are arranged so that heat sinks 4 thereof are adjacent to each other. Other configurations of the present embodiment are the same as those of the seventh embodiment. Note that wirings between the semiconductor modules 1 are not shown for convenience.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As an aspect of the embodiment, a semiconductor module (1) includes: at least one intermediate plate (2) which has heat conductivity; power semiconductor elements (3, 30) which are provided for respective main surfaces (20) of the intermediate plate; heat sinks (4) which are arranged so that the power semiconductor elements are held between the heat sinks and the intermediate plate; and a mold part (10) which seals the intermediate plate, the power semiconductor elements, and the heat sinks with mold resin. Surfaces of the heat sinks opposite to the side of the power semiconductor elements are exposed from the mold part. The intermediate plate has an intermediate radiator (21) which projects in the direction parallel to the main surface from the mold part.

The semiconductor module has power semiconductor elements which are provided for respective main surfaces of the intermediate plate, and heat sinks which are arranged so that the power semiconductor elements are held between the heat sinks and the intermediate plate. That is, each of the power semiconductor elements is held between the heat sink and the intermediate plate. Hence, heat generated from the power semiconductor elements can be transferred from the both main surfaces thereof to both of the intermediate plate and the heat sink.

In addition, surfaces of the heat sinks opposite to the side of the power semiconductor elements are exposed from the mold part. The intermediate plate has an intermediate radiator which projects in the direction parallel to the main surface from the mold part. Hence, the heat sink can radiate heat transferred from the power semiconductor elements to the outside of the semiconductor module via the exposed part. Similarly, the intermediate plate can radiate heat transferred from the power semiconductor elements to the outside of the semiconductor module via the intermediate radiator. As a result, heat removal of the semiconductor module can be improved.

In addition, since the power semiconductor element is disposed on each of a pair of main surfaces of the intermediate plate, the area of the heat sink can be decreased. As a result, the semiconductor module can be easily miniaturized.

As described above, according to the above embodiments, a semiconductor module can be provided which is small in size and has excellent heat removal.

In the semiconductor module, "the intermediate plate which has heat conductivity" means that, for example, heat conductivity of the intermediate plate is higher than that of the mold resin.

The intermediate plate preferably has anisotropy in thermal conductivity. Thermal conductivity in the projection direction of the intermediate radiator is higher than thermal conductivity in the width direction orthogonal to both the projection direction and the thickness direction of the intermediate radiator.

In this case, heat generated from the power semiconductor elements can be easily transferred toward the intermediate radiator. As a result, heat removal of the semiconductor module can be further improved.

The intermediate plate preferably has thermal conductivity in the thickness direction higher than thermal conductivity in the width direction.

In this case, heat generated from the power semiconductor elements is diffused in the thickness direction from the main surface of the intermediate plate and is easily diffused in the projection direction of the intermediate plate. Thereby, heat can be easily transferred from the power semiconductor elements toward the intermediate radiator. Then, the heat transferred to the intermediate radiator is further diffused in the thickness direction. Hence, heat can be easily removed to the outside of the intermediate radiator. As a result, heat removal of the semiconductor module can be further improved.

In addition, the power semiconductor elements may be arranged at the same position when viewed in the thickness direction of the intermediate plate.

In this case, the power semiconductor element disposed at the side of one main surface of the intermediate plate and the power semiconductor element disposed at the side of the other main surface of the intermediate plate are positioned so as to overlap with each other in the projection direction and the width direction. Hence, the area of the intermediate plate required for installing the power semiconductor element can be decreased. As a result, the intermediate plate can be miniaturized, which can easily miniaturize the semiconductor module.

In addition, control terminals (12, 120, 121) which transmit and receive control signals of the power semiconductor elements and the power semiconductor elements may be connected via a flexible board (13).

In this case, solder can be used to connect between the flexible board, and the power semiconductor elements and the control terminals. Hence, jointing the power semiconductor elements with solder and jointing the flexible board can be simultaneously performed. As a result, assembling the semiconductor module is improved, which can easily manufacture the semiconductor module.

In addition, the power semiconductor element disposed at the side of one main surface of the intermediate plate may have a projection area projecting to the outside of the intermediate plate when viewed in the thickness direction of the intermediate plate, and may be connected to the control terminal via a bonding wire (14) on a bonding pad (33) formed in the projection area.

In this case, the connection between the power semiconductor element and the control terminals can be performed at low cost.

In addition, the heat sink disposed at the side of the other main surface (20b) of the intermediate plate may be disposed so as not to overlap with the area where the bonding wire is arranged when viewed in the thickness direction of the intermediate plate.

In this case, the connection between the bonding wires and the control terminals can be performed after the intermediate plates, the power semiconductor elements, and the pair of heat sinks are assembled. As a result, flexibility in a process of fabricating the semiconductor module increases, which can easily produce the semiconductor module.

In addition, three power semiconductor elements (3a) may be arranged on one main surface of the intermediate plates, and the other three power semiconductor elements (3b) may be arranged on the other main surface of the intermediate plates. The six power semiconductor elements may be connected to one another to form an inverter circuit. The semiconductor module may further include first control terminals (120) and second control terminals (121) which project from the mold part in the directions parallel to the main surfaces of the intermediate plate and opposite to each other, the first control terminals transmitting control signals to the three power semiconductor elements arranged on one main surface of the intermediate plate and receiving control signals from the three power semiconductor elements arranged on one main surface of the intermediate plate, and the second control terminals transmitting control signals to the three power semiconductor elements arranged on the other main surface of the intermediate plate and receiving control signals from the three power semiconductor elements arranged on the other main surface of the intermediate plate.

In this case, the first control terminal and the second control terminal project in the directions opposite to each other. Hence, the volume of the mold part can be decreased. As a result, the semiconductor module can be further miniaturized.

In addition, a semiconductor device may be configured which includes the above semiconductor module and an evaporative cooler (50) which cools the semiconductor module. The evaporative cooler includes: a boiling part and (52) which encloses the semiconductor module and refrigerant liquid (51), and is configured so that the intermediate radiator of the intermediate plate in the semiconductor module is immersed in the refrigerant liquid; and a condenser (53) which is disposed above the boiling part and condenses vapor of the refrigerant liquid generated due to heat generation of the semiconductor module.

In this case, heat transferred from the power semiconductor elements to the pair of heat sinks and the intermediate radiators is transferred to the refrigerant liquid which contacts the heat sinks and the intermediate radiators. Then, at least part of the refrigerant liquid evaporates. Thereby, the heat transferred to the heat sinks and the intermediate radiators can be efficiently removed as heat of vaporization of the refrigerant liquid. As a result, heat removal of the semiconductor module can be improved.

In addition, power terminals (15) which provide electric power to the semiconductor module and receive electric power from the semiconductor module and control terminals which transmit control signals to the semiconductor module and receive control signals from the semiconductor module may project from the mold part in the direction which differs from the direction in which the intermediate radiator projects.

In the semiconductor device, bubbles of the refrigerant liquid are generated from the portions where the intermediate radiators contact the refrigerant liquid. Hence, by the configuration in which the power terminals and the control terminals project in the direction which differs from the direction in which the intermediate radiator projects, the bubbles of the refrigerant liquid are not prevented from rising by the terminals. As a result, the refrigerant liquid can be supplied to the pair of heat sinks and the intermediate radiators without delay. Hence, heat removal of the semiconductor module can be improved.

In addition, the semiconductor module may be disposed so that the intermediate radiator extends upward.

In this case, bubbles of the refrigerant liquid generated from the intermediate radiator are not prevented from rising by the semiconductor module. Thereby, the refrigerant liquid can be supplied to the pair of heat sinks and the intermediate radiators without delay. Hence, heat removal of the semiconductor module can be improved.

In addition, each intermediate radiator may have an equal cross-sectional shape perpendicular to the projection direction of the intermediate radiator, and the cross-sectional shape may have comb tooth parts (211).

In this case, bubbles of the refrigerant liquid generated from the intermediate radiators having equal cross-sectional shapes are not prevented from rising by the intermediate radiators. In addition, since the surface area of the intermediate radiator increases due to the comb tooth parts, heat exchange between the intermediate radiators and the refrigerant liquid can be efficiently performed. Hence, heat removal of the semiconductor module can be improved.

In addition, the intermediate radiator may be arranged in the horizontal direction.

In this case, bubbles of the refrigerant liquid generated from the intermediate radiator are not prevented from rising by the semiconductor module. Hence, heat removal of the semiconductor module can be improved.

In addition, the power terminals and the control terminals may be arranged so as not to overlap with the intermediate radiator when viewed from above.

In this case, bubbles of the refrigerant liquid are not prevented from rising by the power terminals and the control terminals. Hence, heat removal of the semiconductor module can be improved.

In addition, a porous layer (210) may be provided on a surface of the intermediate radiator.

In this case, since the refrigerant liquid can penetrate into the porous layer, the area where the refrigerant liquid contacts the intermediate radiator increases, which can efficiently perform heat exchange. As a result, heat removal of the semiconductor module can be further improved.

What is claimed is:

1. A semiconductor module, comprising;
at least one intermediate plate which has heat conductivity;
power semiconductor elements which are provided for respective main surfaces of the intermediate plate;
heat sinks which are arranged so that the power semiconductor elements are held between the heat sinks and the intermediate plate; and
a mold part which seals the intermediate plate, the power semiconductor elements, and the heat sinks with mold resin, wherein
surfaces of the heat sinks opposite to a side of the power semiconductor elements are exposed from the mold part,
the intermediate plate has an intermediate radiator which projects in a direction parallel to the main surfaces from the mold part;
the intermediate plate has anisotropy in thermal conductivity, and
thermal conductivity in the projection direction of the intermediate radiator is higher than thermal conductivity in the width direction orthogonal to both the projection direction and the thickness direction of the intermediate radiator.

2. The semiconductor module according to claim 1, wherein
the intermediate plate has thermal conductivity in the thickness direction higher than thermal conductivity in the width direction.

3. The semiconductor module according to claim 1, wherein
the power semiconductor elements are arranged at aligned positions when viewed in the thickness direction of the intermediate plate.

4. A semiconductor module, comprising:
at least one intermediate plate which has heat conductivity:
power semiconductor elements which are provided for respective main surfaces of the intermediate plate;
heat sinks which are arranged so that the power semiconductor elements are held between the heat sinks and the intermediate plate; and
a mold part which seals the intermediate plate, the power semiconductor elements, and the heat inks with mold resin, wherein
surfaces of the heat sinks opposite to a side the power semiconductor elements are exposed from the mold part,
the intermediate plate has an intermediate radiator which projects in a direction parallel to the main surfaces from the mold part;
the semiconductor module further comprises:
control terminals which transmit and receive control signals of the power semiconductor elements, and
a flexible board via which the control terminals and the power semiconductor elements are connected.

5. A semiconductor module, comprising:
at least one intermediate plate which has heat conductivity:
power semiconductor elements which are provided for respective main surfaces of the intermediate plate;
heat sinks which are arranged so that the power semiconductor elements are held between the heat sinks and the intermediate plate; and
a mold part which seals the intermediate plate, the power semiconductor elements, and the heat sinks with mold resin, wherein
surfaces of the heat sinks opposite to a side of the power semiconductor elements are exposed from the mold part,
the intermediate plate has an intermediate radiator which projects in a direction parallel to the main surfaces from the mold part:
at least one of the power semiconductor elements disposed at a side of one main surface of the intermediate plate has a projection area projecting to the outside of the intermediate plate when viewed in the thickness direction of the intermediate plate, and is connected to a control terminal via a bonding wire on a bonding pad formed in the projection area; and
the heat sink disposed at the side of the other main surface of the intermediate plate is disposed so as not to overlap with an area where the bonding wire is arranged when viewed in the thickness direction of the intermediate plate.

6. A semiconductor module, comprising:
at least one intermediate plate which has cat conductivity;
power semiconductor elements which are provided for respective main surfaces of the intermediate plate;
heat sinks which are arranged so that the power semiconductor elements are held between the heat sinks and the intermediate plate; and
a mold part which seals the intermediate plate, the power semiconductor elements, and the heat sinks with mold resin, wherein
surfaces of the heat sinks opposite to a side of the power semiconductor elements are exposed from the mold part,
the intermediate plate has an intermediate radiator which projects in a direction parallel to the main surfaces from the mold part;
three of the power semiconductor elements are arranged on one main surface of the intermediate plate, and another three of the power semiconductor elements are arranged on the other main surface of the intermediate plate,
the six power semiconductor elements are connected to one another to form an inverter circuit, further comprising:
first control terminals and second control terminals which project from the mold part in the directions parallel to the main surfaces of the intermediate plate and opposite to each other, the first control terminals transmitting control signals to the three power semiconductor elements arranged on one main surface of the intermediate plate and receiving control signals from the three power semiconductor elements arranged on said one main surface of the intermediate plate, and the second control terminals transmitting control signals to the three power semiconductor elements arranged on the other main surface of the intermediate plate and receiving control signals from the three power semiconductor elements arranged on the other main surface of the intermediate plate.

7. A semiconductor device comprising:
the semiconductor module comprising:
- at least one intermediate plate which has heat conductivity;
- power semiconductor elements which are provided for respective main surfaces of the intermediate plate;
- heat sinks which are arranged so that the power semiconductor elements are held between the heat sinks and the intermediate plate; and
- a mold part which seals the intermediate plate, the power semiconductor elements, and the heat sinks with mold resin, wherein
- surfaces of the heat sinks opposite to a side of the power semiconductor elements are exposed from the mold part,
- the intermediate plate has an intermediate radiator which projects in a direction parallel to the main surfaces from the mold part; and an evaporative cooler which cools the semiconductor module, wherein the evaporative cooler includes:
- a boiling part and which encloses the semiconductor module and refrigerant liquid, and is configured so that the intermediate radiator of the intermediate plate in the semiconductor module is immersed in the refrigerant liquid; and
- a condenser which is disposed above the boiling part and condenses vapor of the refrigerant liquid generated due to heat generation of the semiconductor module;

wherein;
the semiconductor module is disposed so that the intermediate radiator extends upward;
the intermediate radiator has an equal cross-sectional shape perpendicular to the projection direction of the intermediate radiator, and
the cross-sectional shape has comb tooth parts.

8. The semiconductor device according to claim 7, further comprising:
power terminals which provide electric power to the semiconductor module and receive electric power from the semiconductor module; and
control terminals which transmit control signals to the semiconductor module and receive control signals from the semiconductor module, wherein
the power terminals and the control terminals project from the mold part in a direction which differs from the direction in which the intermediate radiator projects.

9. The semiconductor device according to claim 7, wherein the intermediate radiator is arranged in the horizontal direction.

10. The semiconductor device according to claim 9, wherein the power terminals and the control terminals are arranged so as not to overlap with the intermediate radiator when viewed from above.

11. A semiconductor device, comprising:
the semiconductor module comprising:
- at least one intermediate plate which has heat conductivity;
- power semiconductor elements which are provided for respective main surfaces of the intermediate plate;
- heat sinks which are arranged so that the power semiconductor elements a held between the heat sinks and the intermediate plate; and
- a mold part which seals the intermediate plate, the power semiconductor elements, and the heat sinks with mold resin, wherein
- surfaces of the heat sinks opposite to a side of the power semiconductor elements are exposed from the mold part,
- the intermediate plate has an intermediate radiator which projects in a direction parallel to the main surfaces from the mold part;

an evaporative cooler which cools the semiconductor module, wherein the evaporative cooler includes:
- a boiling part and which encloses the semiconductor module and refrigerant liquid, and is configured so that the intermediate radiator of the intermediate plate in the semiconductor module is immersed in the refrigerant liquid; and
- a condenser which is disposed above the boiling part and condenses vapor of the refrigerant liquid generated due to heat generation of the semiconductor module; and a porous layer which is provided on a surface of the intermediate radiator.

* * * * *